(12) United States Patent  
Mizawa et al.

(10) Patent No.: US 9,354,512 B2  
(45) Date of Patent: May 31, 2016

(54) RESIN MOLD FOR IMPRINTING AND METHOD FOR PRODUCING THE SAME

(75) Inventors: Takahide Mizawa, Sayama (JP); Satoshi Uehara, Sayama (JP)

(73) Assignee: Soken Chemical & Engineering Co., Ltd., Tokyo (JP)

( * ) Notice: Subject to any disclaimer, the term of this patent is extended or adjusted under 35 U.S.C. 154(b) by 426 days.

(21) Appl. No.: 13/389,138

(22) PCT Filed: Aug. 6, 2010

(86) PCT No.: PCT/JP2010/063375  
§ 371 (c)(1), (2), (4) Date: Feb. 6, 2012

(87) PCT Pub. No.: WO2011/016549  
PCT Pub. Date: Feb. 10, 2011

(65) Prior Publication Data  
US 2012/0133077 A1 May 31, 2012

(30) Foreign Application Priority Data

Aug. 7, 2009 (JP) ................................ 2009-184915  
Aug. 2, 2010 (JP) ................................ 2010-173812

(51) Int. Cl.  
*B29C 59/02* (2006.01)  
*G03F 7/00* (2006.01)  
(Continued)

(52) U.S. Cl.  
CPC .............. *G03F 7/0002* (2013.01); *B29C 33/56* (2013.01); *B82Y 10/00* (2013.01); *B82Y 40/00* (2013.01); *B29C 33/40* (2013.01); *B29C 33/424* (2013.01); *B29C 33/60* (2013.01); *G03F 7/11* (2013.01)

(58) Field of Classification Search  
CPC ........... G03F 7/11; B29C 33/40; B29C 33/60; B29C 33/424  
USPC ................. 264/293, 241, 226, 446, 447; 425/174.4, 385, 436 RM  
See application file for complete search history.

(56) References Cited

U.S. PATENT DOCUMENTS 6,530,554 B2   3/2003   Shimmo et al.  
7,819,652 B2   10/2010  Lee et al.  
(Continued)

FOREIGN PATENT DOCUMENTS

CN   101052667   10/2007  
JP   09314654 A   12/1997  
(Continued)

OTHER PUBLICATIONS

"Hydrophobicity, Hydrophilicity and Silanes", Barry Arkles, Gelest Inc., Oct. 2006, pp. 1 and 6, http://www.gelest.com/goods/pdf/Library/advances/HydrophobicityHydrophilicityandSilanes.pdf; accessed Jun. 5, 2014.*

*Primary Examiner* — Alison L Hindenlang  
*Assistant Examiner* — Lawrence D Hohenbrink, Jr.  
(74) *Attorney, Agent, or Firm* — The Webb Law Firm

(57) ABSTRACT

Provided is a resin mold for imprinting which is free from transfer defects, has excellent releasability from a resin subjected to imprinting, and does not cause any defect by imprinting. The resin mold for imprinting includes a resin layer having a recessed and projected pattern surface, an inorganic material layer formed with a uniform thickness on at least the recessed and projected pattern surface of the resin layer, and a release agent layer formed with a uniform thickness on at least the recessed and projected pattern surface of the inorganic material layer.

13 Claims, 7 Drawing Sheets

(51) Int. Cl.
*B29C 33/56* (2006.01)
*B82Y 10/00* (2011.01)
*B82Y 40/00* (2011.01)
*G03F 7/11* (2006.01)
*B29C 33/60* (2006.01)
*B29C 33/40* (2006.01)
*B29C 33/42* (2006.01)

(56) References Cited

U.S. PATENT DOCUMENTS

| | | | |
|---|---|---|---|
| 8,016,585 B2 | 9/2011 | Komoriya et al. | |
| 2002/0127499 A1 | 9/2002 | Endo et al. | |
| 2002/0190433 A1 | 12/2002 | Shimo et al. | |
| 2003/0001069 A1 | 1/2003 | Shimmo et al. | |
| 2006/0249886 A1* | 11/2006 | Chao | B29C 43/003 264/496 |
| 2008/0061214 A1* | 3/2008 | Lee | B29C 33/424 249/112 |
| 2010/0078854 A1* | 4/2010 | Berggren | B82Y 10/00 264/293 |
| 2010/0304087 A1* | 12/2010 | Kusuura | B29C 33/424 428/156 |
| 2012/0247950 A1* | 10/2012 | Kaida | B29C 33/424 204/192.15 |

FOREIGN PATENT DOCUMENTS

| | | | | |
|---|---|---|---|---|
| JP | 2001009843 A | 1/2001 | | |
| JP | 2001269942 A | 10/2001 | | |
| JP | 2006272947 A | 10/2006 | | |
| JP | 2007245684 A | 9/2007 | | |
| JP | 200868612 | 3/2008 | | |
| JP | 2008221491 A | 9/2008 | | |
| JP | 2008223110 A | 9/2008 | | |
| JP | 2008290330 A | 12/2008 | | |
| JP | 2009119695 A | 6/2009 | | |
| JP | 2009184117 A | 8/2009 | | |
| WO | 2008149544 A1 | 12/2008 | | |
| WO | WO 2008149544 A1 * | 12/2008 | | B29C 33/424 |
| WO | WO 2009020196 A1 * | 2/2009 | | B29C 33/424 |
| WO | 2009084408 A1 | 7/2009 | | |
| WO | 2009148138 A1 | 12/2009 | | |
| WO | WO 2009148138 A1 * | 12/2009 | | B29C 33/424 |

* cited by examiner (a)

(b)

(c)

(d)

(a)

(b)

(c)

(d)

(e)

(a)

(b)

RESIN MOLD FOR IMPRINTING AND METHOD FOR PRODUCING THE SAME

TECHNICAL FIELD

The present invention relates to a resin mold for imprinting and a method for producing the same. More particularly, the present invention relates to a resin mold for imprinting with a multi-layer structure having good releasability from a resin subjected to imprinting, and a method for producing the same.

BACKGROUND ART

Imprinting technique is a process to press a mold on which a recessed and projected pattern has been formed, on a liquid resin or the like present on a substrate, thereby transferring the pattern of the mold into the resin. The recessed and projected pattern has a size ranging from a nano scale of a 10 nm level to about 10 μm. This technique has been applied in various fields including semiconductor materials, optical materials, recording media, micromachine, biology, and environment.

Exemplary imprinting includes heat imprinting and photo-imprinting. In the heat imprinting, a mold on which a pre-scribed form has been formed is press-contacted with a thermoplastic resin prepared by melting at a glass transition temperature or higher, thereby heat-imprinting the surface form of the mold into the thermoplastic resin, and after cooling, the mold is detached. In the photo-imprinting, a mold as described above is pressed on a photo-curable resin and the photo-curable resin is cured by an energy ray such as ultraviolet ray, and then the mold is detached.

On the other hand, as a mold, quartz, silicon, or the like is usually used in view of strength, hardness, processability, dimensional stability, etc. These materials, however, have problems such as fragility, expensiveness, and time-consuming for their preparation. In order to overcome these problems, these molds, e.g., quartz, are used as a master mold to prepare a replica mold to thereby deal with mass production.

As the replica mold, a resin mold has been known in view of versatility and cost. In obtaining the resin replica mold from a mother pattern composed of a resin obtained from the master mold, good compatibility between the resins, namely between the surface of the mother pattern and the surface of the replica mold, made it difficult to release the replica mold from the mother pattern. There is thus a report of using a specific resin to achieve releasability (for example, Patent document 1). However, resins employable for the replica mold were limited and thus this led to poor versatility. Moreover, there was no report on releasability of the replica mold in the case of using the replica mold for the imprinting into a resin.

Meanwhile, to allow a mold to have releasability from the resin subjected to imprinting, it is known to apply a coupling agent, such as a silane coupling agent, as a release agent, onto a transfer type surface of a glass substrate or the like, thereby making a surface energy of the mold be within an appropriate range to achieve releasability (for example, Patent document 2). However, the difficulty in the release agent adhering onto the transfer type surface caused problems, such as the peeling of the release agent, and the difficulty in controlling the thickness of the release agent layer to prevent the peeling.

A further example of a mold having releasability from a resin subjected to imprinting is a mold provided with a photo-catalyst layer formed on a substrate, the photo-catalyst layer being composed of two layers and having a recessed and projected surface, thereby the photo catalytic performance decomposing adhesive power and bonding power between the mold and the resin subjected to imprinting. In this mold, furthermore, the photo-catalyst performance decomposes an organic material lying between the photo-catalyst layer and the surface of the cured resin subjected to imprinting, thereby making it easy to remove a contamination from the mold (for example, Patent document 3). However, the two-layer structure of the photo-catalyst layer makes the resultant mold have a poor flexibility. Furthermore, since this process relies on the photo-catalyst performance to achieve the releasability, resins to be subjected to imprinting are limited to photo-curable resins.

CITATION LIST

Patent Documents

Patent document 1: JP-A-2007-245684
Patent document 2: JP-A-2001-269942
Patent document 3: JP-A-2008-221491

SUMMARY OF THE INVENTION

Problem to be Solved by the Invention

It is an object of the present invention to provide a resin mold for imprinting which is free from transfer defects, has excellent releasability from a resin subjected to imprinting, and does not cause any defect by imprinting. It is another object of the present invention to provide a resin mold for imprinting in which a resin employed for a resin layer of the mold has no limitation, and which can be mass produced inexpensively. It is a further object of the present invention to provide a flexible resin mold for imprinting which can be used by being fixed to a roller and the like.

Means for Solving the Problem

The invention relates to, for example, the following [1] to [17].

[1] A resin mold for imprinting comprising:
a resin layer having a recessed and projected pattern surface,
an inorganic material layer formed with a uniform thickness on at least the recessed and projected pattern surface of the resin layer, and
a release agent layer formed with a uniform thickness on at least the recessed and projected pattern surface of the inorganic material layer.

[2] A resin mold for imprinting comprising:
a substrate,
a resin layer having a recessed and projected pattern surface formed on the substrate,
an inorganic material layer formed with a uniform thickness on at least the recessed and projected pattern surface of the resin layer, and
a release agent layer formed with a uniform thickness on at least the recessed and projected pattern surface of the inorganic material layer.

[3] The resin mold for imprinting as described in [1] or [2], wherein the release agent layer has a thickness of 0.5 to 20 nm.

[4] The resin mold for imprinting as described in any one of [1] to [3], wherein the inorganic material layer has a thickness of 0.5 to 100 nm.

[5] The resin mold for imprinting as described in any one of [1] to [4], wherein the inorganic material layer is composed of at least one inorganic material selected from the group consisting of $SiO_2$, $ZrO_2$, $ZnO$, $Ta_2O_5$, $HfO_2$, ITO, FTO, $TiO_2$, Si and SiC.

[6] The resin mold for imprinting as described in any one of [1] to [5], wherein the release agent layer is composed of at least one release agent selected from the group consisting of a fluorine-based silane coupling agent, a perfluoro compound having an amino group or a carboxyl group, and a perfluoroether compound having an amino group or a carboxyl group.

[7] The resin mold for imprinting as described in any one of [1] to [6], wherein the resin layer is composed of a thermoplastic resin, a thermosetting resin, or a photo-curable resin.

[8] The resin mold for imprinting as described in any one of [1] to [7], wherein the resin layer is at least one resin selected from the group consisting of an acrylic resin, a styrene resin, an epoxy resin, a polyester resin, an olefin resin, and a polycarbonate resin.

[9] The resin mold for imprinting as described in any one of [2] to [8], wherein the substrate is at least one substrate selected from the group consisting of a resin, glass, silicon, sapphire, gallium nitride, carbon and silicon carbide.

[10] The resin mold for imprinting as described in any one of [2] to [9], wherein the substrate is at least one resin selected from the group consisting of polyethylene terephthalate, polycarbonate, polymethyl methacrylate, polystyrene, cyclic polyolefin, polyimide, polysulfone, polyether sulfone, and polyethylene naphthalate.

[11] The resin mold for imprinting as described in any one of [1] to [10], wherein a contact angle of a surface of the release agent layer with respect to pure water is 100° or more.

[12] The resin mold for imprinting as described in any one of [1] to [11], wherein in a desired form formed on a surface of the resin layer, the surface form has a repeating unit having a cycle of 10 nm to 50 µm.

[13] A method for producing a resin mold for imprinting comprising:
a step of contacting a mold with a resin layer so as to transfer a recessed and projected pattern formed on a surface of the mold into a one-side surface of the resin layer,
a step of forming an inorganic material layer with a uniform thickness on at least a recessed and projected pattern surface of the resin layer, and
a step of forming a release agent layer with a uniform thickness on at least a recessed and projected pattern surface of the inorganic material layer.

[14] A method for producing a resin mold for imprinting comprising:
a step of forming a resin layer on a substrate,
a step of contacting a mold with the resin layer so as to transfer a recessed and projected pattern formed on a surface of the mold into a surface of the resin layer,
a step of forming an inorganic material layer with a uniform thickness on at least a recessed and projected pattern surface of the resin layer, and
a step of forming a release agent layer with a uniform thickness on at least a recessed and projected pattern surface of the inorganic material layer.

[15] A method for using the resin mold for imprinting as described in any one of [1] to [12] comprising:
a step of contacting the resin mold for imprinting as described in any one of [1] to [12] with a surface of a resin, and
step of releasing the resin mold for imprinting from the resin.

[16] A method for using the resin mold for imprinting as described in [15], wherein the resin is a photo-curable resin.

[17] The resin mold for imprinting as described in anyone of [1] to [12], which is fixed to a roller.

Furthermore, the resin mold for imprinting of the present invention can adopt the following embodiments [18] to [35].

[18] A resin mold for imprinting comprising:
a solvent-resistant cured resin layer of thermoplastic nature, thermosetting nature, or photo-curable nature, the cured resin layer having a recessed and projected pattern surface,
an inorganic material layer formed with a uniform thickness on at least the recessed and projected pattern surface of the cured resin layer while relatively changing a positional relationship between a target and an adherend with rotation and revolution, and
a release agent layer formed with a uniform thickness on at least a recessed and projected pattern surface of the inorganic material layer.

[19] The resin mold for imprinting as described in [18] comprising:
a substrate,
a solvent-resistant cured resin layer of a thermoplastic nature, thermosetting nature or photo-curable nature, the cured resin layer being formed on the substrate and having a recessed and projected pattern surface,
an inorganic material layer formed with a uniform thickness on at least the recessed and projected pattern surface of the cured resin layer while relatively changing a positional relationship between a target and an adherend with rotation and revolution, and
a release agent layer formed with a uniform thickness on at least a recessed and projected pattern surface of the inorganic material layer.

[20] The resin mold for imprinting as described in [18] or [19], which is obtained by depositing an inorganic material containing a target-forming component, on at least the recessed and projected pattern surface of the cured resin layer, while rotating and revolving, with respect to the target, the cured resin on which the inorganic material layer is to be formed.

[21] The resin mold for imprinting as described in any one of [18] to [20], wherein the release agent layer has a thickness of 0.5 to 20 nm.

[22] The resin mold for imprinting as described in any one of [18] to [20], wherein the inorganic material layer has a thickness of 0.5 to 100 nm.

[23] The resin mold for imprinting as described in any one of [18] to [22], wherein the inorganic material layer is composed of at least one inorganic material selected from the group consisting of $SiO_2$, $ZrO_2$, $ZnO$, $Ta_2O_5$, $HfO_2$, ITO, FTO, $TiO_2$, Si and SiC.

[24] The resin mold for imprinting as described in any one of [18] to [23], wherein the release agent layer is composed of at least one release agent selected from the group consisting of a fluorine-based silane coupling agent, a perfluoro compound having an amino group or a carboxyl group, and a perfluoroether compound having an amino group or a carboxyl group.

[25] The resin mold for imprinting as described in any one of [18] to [24], wherein the resin layer is composed of a thermoplastic resin, a thermosetting resin, or a photo-curable resin.

[26] The resin mold for imprinting as described in any one of [18] to [25], wherein the resin layer is at least one resin selected from the group consisting of an acrylic resin, a styrene resin, an epoxy resin, a polyester resin, an olefin resin, and a polycarbonate resin, or a cured product of these resins.

[27] The resin mold for imprinting as described in any one of [18] to [26], wherein the substrate is at least one substrate selected from the group consisting of a resin, glass, silicon, sapphire, gallium nitride, carbon and silicon carbide.

[28] The resin mold for imprinting as described in any one of [18] to [27], wherein the substrate is at least one resin selected from the group consisting of polyethylene terephthalate, polycarbonate, polymethyl methacrylate, polystyrene, cyclic polyolefin, polyimide, polysulfone, polyether sulfone, and polyethylene naphthalate.

[29] The resin mold for imprinting as described in any one of [18] to [28], wherein a contact angle of a surface of the release agent layer with respect to pure water is 100° or more.

[30] The resin mold for imprinting as described in any one of [18] to [29], wherein in a desired form formed on the surface of the resin layer, the surface form has a repeating unit having a cycle of 10 nm to 50 μm.

[31] A method for producing a resin mold for imprinting comprising:
a step of contacting a mold with a thermoplastic, thermosetting or photo-curable resin layer so as to transfer a recessed and projected pattern formed on a surface of the mold into a one-side surface of the resin layer,
a step of curing the thermoplastic, thermosetting or photo-curable resin layer,
a step of forming an inorganic material layer with a uniform thickness on a recessed and projected pattern surface of the resin layer while relatively changing a positional relationship between a target and an adherend with rotation and revolution, and
a step of forming a release agent layer with a uniform thickness on a recessed and projected pattern surface of the inorganic material layer.

[32] A method for producing a resin mold for imprinting comprising:
a step of forming a thermoplastic, thermosetting or photo-curable resin layer on a substrate,
a step of contacting a mold with the thermoplastic, thermosetting or photo-curable resin layer so as to transfer a recessed and projected pattern formed on a surface of the mold into a surface of the resin layer,
a step of curing the thermoplastic, thermosetting or photo-curable resin layer,
a step of forming an inorganic material layer with a uniform thickness on a recessed and projected pattern surface of the resin layer while relatively changing a positional relationship between a target and an adherend with rotation and revolution, and
a step of forming a release agent layer with a uniform thickness on a recessed and projected pattern surface of the inorganic material layer.

[33] A method for using a resin mold for imprinting comprising a step of contacting the resin mold for imprinting as described in any one of [18] to [30] with a surface of a resin, and a step of releasing the resin mold for imprinting from the resin.

[34] The method for using a resin mold for imprinting as described in [33], wherein the resin is a photo-curable resin.

[35] The method for using a resin mold for imprinting as described in any one of [18] to [30], which is fixed to a roller.

The resin mold for imprinting of the present invention enables imprinting without causing any transfer defect. Further, the provision of an inorganic material layer between a resin layer and a release agent layer improves the adhesion between each layer of the resin mold for imprinting, and consequently, after imprinting, the releasability of the resin mold for imprinting from a resin subjected to imprinting is good, and the peeling of the release agent layer of the mold does not occur. Further, the thickness of the release agent layer can be controlled, and thus the release agent layer does not affect the precision of edging.

In particular, the formation of the inorganic material layer through the deposition of an inorganic material, with rotation and revolution, can form the inorganic material layer with higher uniformity.

Further, in the resin mold for imprinting of the present invention, there is little limitation for resins employable for the resin layer, and thus the resin mold for imprinting has versatility, and moreover can be mass produced inexpensively.

Further, the resin mold for imprinting of the present invention comprises the inorganic material layer having a thickness of not more than a prescribed thickness. Thus, in an embodiment, depending on a structure of the mold, the resin mold for imprinting of the present invention can become flexible, and can be applied to various imprinting embodiments such as a roller.

EMBODIMENTS FOR CARRYING OUT THE PRESENT INVENTION

Hereinafter, the invention will be described in detail.

Figure 1:
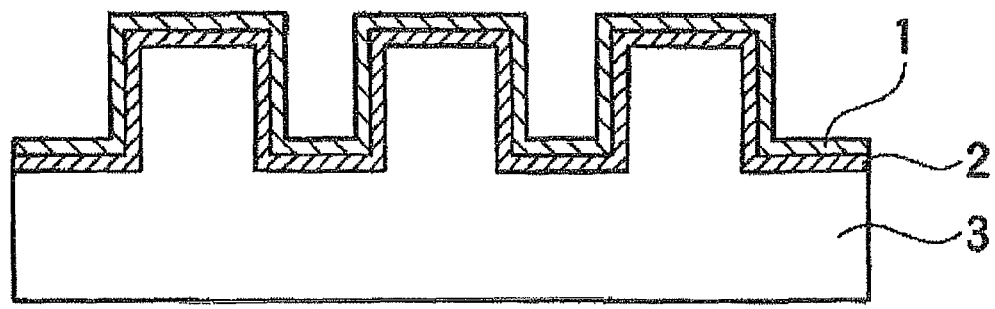
FIG. 1 shows a resin mold for imprinting of the present invention having a three-layer structure.
Figure 2:
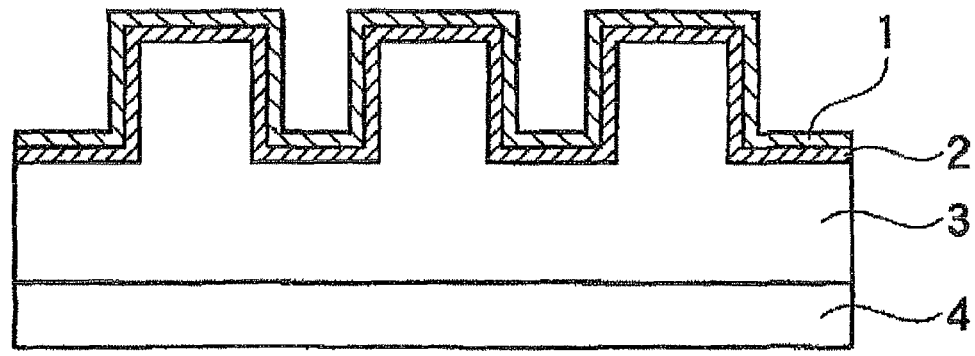
FIG. 2 shows a resin mold for imprinting of the present invention having a four-layer structure.

Description is provided regarding FIGS. 1 and 2, which are schematic sectional views of the resin mold for imprinting of the present invention.

The present invention is directed to a resin mold for imprinting having a multi-layer structure.

In a first embodiment of the present invention, as shown in FIG. 1, a resin mold for imprinting having a three-layer structure is provided which comprises a resin layer 3 having a recessed and projected pattern surface, an inorganic material layer 2 formed with a uniform thickness on at least the recessed and projected pattern surface of the resin layer 3, and a release agent layer 1 formed with a uniform thickness on at least the recessed and projected pattern surface of the inorganic material layer 2.

In a second embodiment of the present invention, as shown in FIG. 2, a resin mold for imprinting having a four-layer structure is provided which comprises a substrate 4, a resin layer 3 having a recessed and projected pattern surface that is formed on the substrate, an inorganic material layer 2 formed with a uniform thickness on at least the recessed and projected pattern surface of the resin layer 3, and a release agent layer 1 formed with a uniform thickness on at least the recessed and projected pattern surface of the inorganic material layer 2.

Conventionally, the adhesion of a release agent onto a resin layer was not good. In the present invention, however, the provision of an inorganic material layer between the resin layer and the release agent layer has enabled the formation with good adhesion of the release agent layer onto the resin layer through the inorganic material layer. Such formation has been achieved as a result of good adhesion between the resin layer and the inorganic material layer and good adhesion between the inorganic material layer and the release agent layer. Accordingly, the release agent layer is not peeled in imprinting, enabling molding with good releasabilty. Furthermore, the inorganic material layer has a thickness of not more than a predetermined thickness, enabling the production of a flexible mold.

The first embodiment of the present invention and the second embodiment of the present invention are related to each other in such a manner that when the substrate is integrated with the resin layer in the four-layer structure of the second embodiment, this corresponds to the embodiment of the three-layer structure of the first embodiment of the present invention. The embodiment where the substrate is integrated with the resin layer refers to an embodiment where the substrate is a resin on which a pattern can be formed with a mold, in which case the substrate represents a resin layer: in other words, the substrate serves as a substrate and a resin layer.

1. Resin Mold for Imprinting

The first and the second embodiments of the present invention each comprise a resin layer, an inorganic material layer and a release agent layer as described below.

(1) Resin Layer Having a Recessed and Projected Pattern Surface (a) Resin

Resins forming the resin layer include thermoplastic resins, thermosetting resins and photo-curable resins. Preferred thermoplastic resins include acrylic resins, styrene resins, olefin resins, polycarbonate resins, and polyester resins. Preferred thermosetting resins or photo-curable resins include epoxy resins. Further preferred examples include polymethyl methacrylate, cycloolefin resins, styrene resins, epoxy resins, polycarbonate, and polyethylene terephthalate.

The aforementioned resins may contain components such as antioxidants, photosensitizers, fillers and leveling agents in a range which does not affect the nature of the aforementioned resins.

(b) Thickness

The resin layer has a thickness of usually 50 nm to 30 μm, preferably 500 nm to 10 μm.

The resin layer having a thickness within the above range has a strength resistant to stamping and a good smoothness and thus can be handled easily.

The thickness of the resin layer as used herein refers to a distance between a bottom surface of the resin layer and the highest surface of the recess and projected surface of the resin layer.

Figure 9:
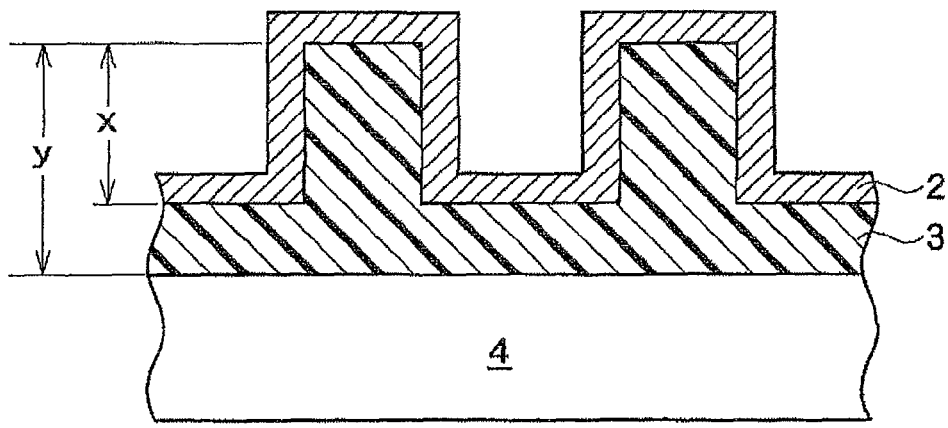
FIG. 9 schematically shows the relationship between a resin substrate and a thickness of a projection formed from a resin in a resin mold for imprinting composed of a resin.

In the present invention, the thickness of the resin film is usually 1 to 15 times, preferably 2 to 12 times, more preferably 3 to 10 times the height of a recess and projection formed on a surface of a master mold. Specifically, when the thickness of the resin is defined as Y and the thickness of the recess and projection is defined as X, as shown in FIG. 9, X and Y are usually in the range of Y=X to Y=15X, and preferably in the range of Y=2X to Y=12X, more preferably in the range of Y=3X to Y=10X. If the thickness of the resin film is less than 1 time the height of the form, the height of the form of the master mold is not reflected at a step such as in heat imprinting during the preparation of the resin mold. If the thickness of the resin film exceeds 15 times, in heat imprinting during the preparation of the resin mold, a resin at the transferred portion over-flows by pressing (which is carried out usually at 20 MPa), and the excess resin frequently forms a projection at a side of the master mold. This makes it difficult to form a resin mold having a uniform transfer surface. The depth of a recess and projection formed on a master mold is correlated with the resin thickness in such a manner as described above, as a result of a considerably smaller depth of a recess and projection employed in resin nanoimprinting in the present invention than that in common-scale imprinting. If Y is a large value, e.g., a value equal to 20X as adopted in common printing technique, it is impossible to form a precise resin replica mold for nanoimprinting.

In the present invention, the resin thickness is an average of thicknesses measured at arbitral five points of the surface using a film thickness measurement instrument (model: F20, manufactured by Filmmetrics, Inc.).

(c) Surface

The resin layer has a desired form on the surface.

The desired form is usually a recess and projection which repeats itself in a predetermined cycle to form a pattern, i.e., a recess and projected pattern, preferably a recess and projected pattern having a cycle of 10 nm to 50 μm, a depth of 10 nm to 100 μm, and a transfer surface of 1.0 to $1.0 \times 10^6$ mm$^2$.

Specific forms of the recess and projection include a line, a column, a monolith, a cone, a polygonal pyramid and a microlens (2) Inorganic Material Layer Formed with a Uniform Thickness on at Least the Recessed and Projected Pattern Surface of the Resin Layer (a) Inorganic Material The inorganic material layer is formed from an inorganic material or an inorganic oxide, preferably an inorganic oxide. Preferred examples of the inorganic oxide include $SiO_2$, $ZrO_2$, ZnO, $Ta_2O_5$, $HfO_2$, ITO, FTO, and $TiO_2$, and more preferred examples thereof include $SiO_2$, $ZrO_2$, $Ta_2O_5$, $HfO_2$, ITO, and $TiO_2$. Preferred examples of the inorganic material include Si and SiC.

The use of the aforementioned inorganic materials as the inorganic material layer improves the adhesion thereof with the resin layer and the release agent layer.

(b) Thickness

The thickness of the inorganic material layer is preferably 0.5 to 100 nm, more preferably 0.5 to 20 nm, most preferably 1 to 10 nm. When the thickness of the inorganic material layer is within the above range, the imprinting can be carried out with good precision and the adhesion thereof with the resin layer and the release agent layer are good.

(c) Surface

The inorganic material layer is formed with a uniform thickness on the resin layer, at least on the recessed and projected pattern surface of the resin layer. The uniform thickness refers to a substantially uniform thickness, and preferably a uniform thickess with a standard deviation of 0.1 to 15. Thus, the surface of the inorganic material layer retains the form of the surface of the resin layer.

(3) Release Agent Layer Formed with a Uniform Thickness on at Least the Recessed and Projected Pattern Surface of the Inorganic Material Layer (a) Release Agent A release agent is a component to decrease a surface energy of a release surface and facilitate releasing.

The release agent layer is preferably composed of at least one kind selected from the group consisting of a fluorine-based silane coupling agent, a perfluoro compound having an amino group or a carboxyl group, and a perfluoroether compound having an amino group or a carboxyl group; more preferably composed of at least one kind selected from the group consisting of a fluorine-based silane coupling agent having an amino group.

The use of the aforementioned examples as the release agent layer improves the adhesion thereof with the inorganic material layer and the releasability thereof from a resin subjected to imprinting.

(b) Thickness

The thickness of the release agent layer is preferably 0.5 to 20 nm, more preferably 0.5 to 10 nm, most preferably 0.5 to 5 nm.

(c) Surface

The release agent layer is formed with a uniform thickness on the inorganic material layer, at least on the recessed and projected pattern surface of the inorganic material layer. The uniform thickness refers to a substantially uniform thickness, and preferably a uniform thickness with a standard deviation of 0.1 to 10. Thus, the surface of the release agent layer retains the form of the surface of the resin layer.

(d) Property of the Surface of the Release Agent Layer

A contact angle of a release agent layer surface of the release agent layer with respect to pure water is preferably 100° or more, more preferably 100 to 130°, still more preferably 100 to 120°.

When the contact angle is within the above range, which represents a low wetting property with respect to a liquid, in the case where a surface of the release agent layer is coated with a liquid resin to be subjected to imprinting, it is considered that the resin can be prevented from being fluidized on the surface of the release agent layer, and the resin subjected to impriniting is readily released from the surface of the release agent layer.

(4) Substrate

In the four-layer structure embodiment of the present invention, the resin layer is formed on a substrate.

As the substrate, preferred is one type selected from the group consisting of a resin, glass, silicon, sapphire, gallium nitride, carbon and silicon carbide.

As the resin employed for the substrate, preferred is one type selected from the group consisting of polyethylene terephthalate, polycarbonate, polymethyl methacrylate, polystyrene, cyclic polyolefin, polyimide, polysulfone, polyether sulfone, and polyethylene naphthalate.

As a form of the resin employed for the substrate, a plate and a film can be mentioned. As a plate form, a polymethyl methacrylate plate, a polycarbonate plate, a polycycloolefin plate and the like can be mentioned; and as a film form, films of polyethylene terephthalate, polycarbonate, cyclic polyolefin, polyimide, polysulfone, polyether sulfone, polyethylene naphthalate and the like can be mentioned, without limiting thereto.

(5) Surface Form of the Resin Mold for Imprinting of the Present Invention

The surface form of the resin mold for imprinting of the present invention is a recessed and projected pattern repeating itself in a predetermine cycle.

The pattern preferably has a cycle of 10 nm to 50 μm.

A mold with a surface pattern form having a cycle of 20 nm to 500 nm is used suitably for semiconductor materials, media, optical elements and the like. A mold with a surface pattern form having a cycle of 200 nm to 20 μm is used suitably for optical materials such as prisms and microlens.

The pattern preferably has a depth of 50 nm to 1 μm, more preferably 100 to 600 nm.

Further, the transfer surface is preferably 1.0 to $0.25 \times 10^6$ mm$^2$.

Specific forms of the recess and projection, which are not particularly limited, include a line, a column, a monolith, a cone, a polygonal pyramid and a microlens.

(6) Roller Type Resin Mold for Imprinting

As an embodiment of the resin mold for imprinting of the present invention, a roller type resin mold for imprinting can be mentioned.

Figure 6:
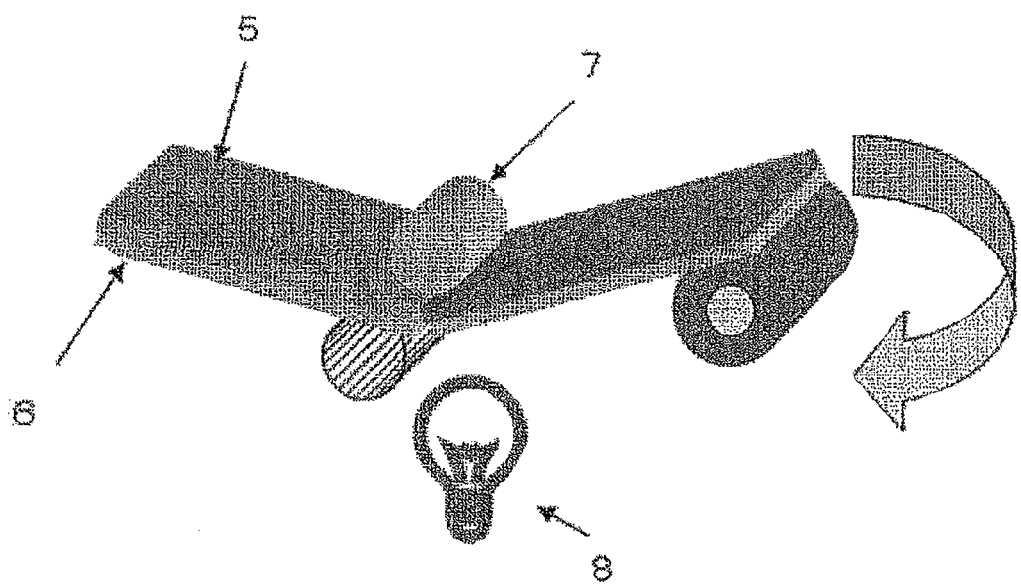
FIG. 6 shows a method for using a roller type resin mold for imprinting of the present invention.
Figure 7:
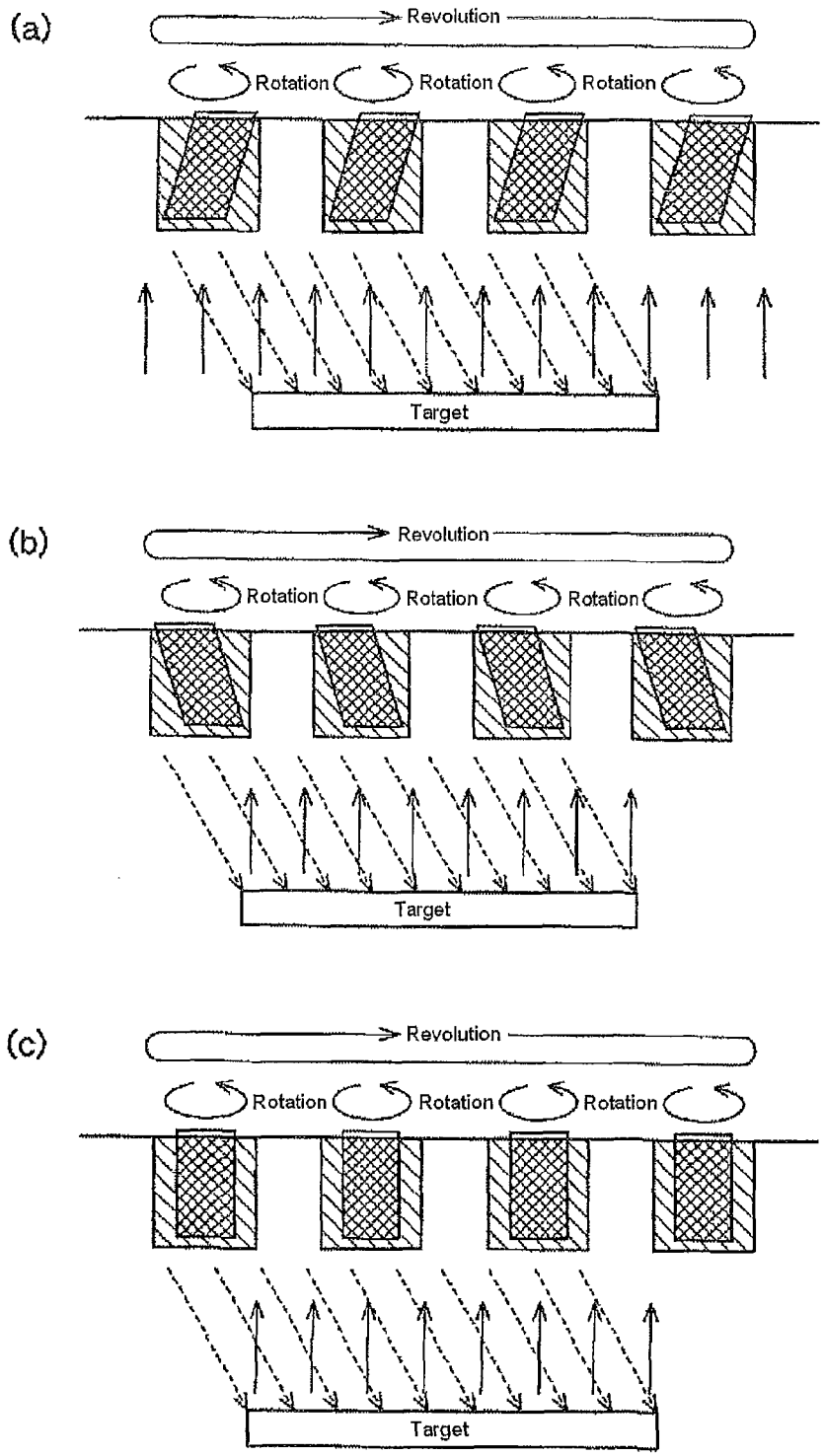
FIG. 7 schematically shows the deposition of a metal while rotating and revolving an adherend.
Figure 8:
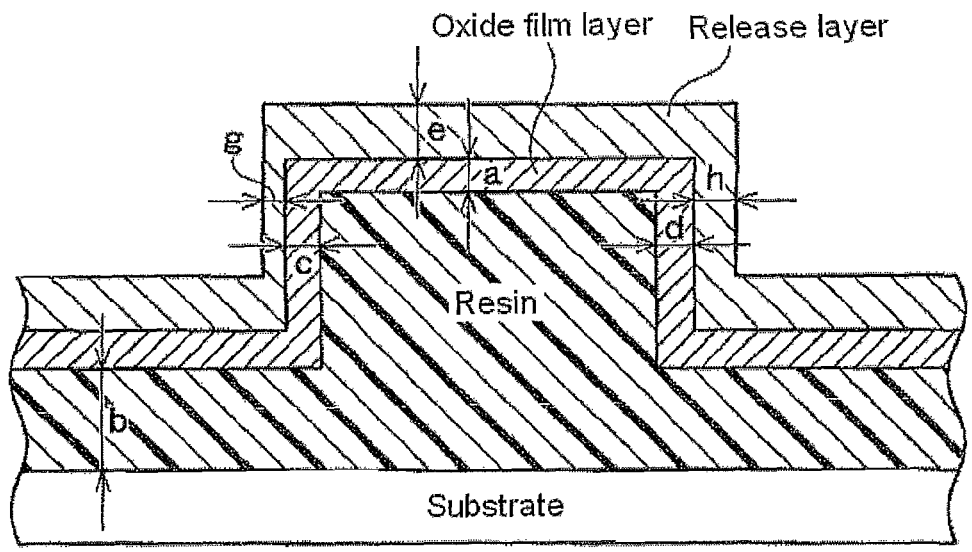
FIG. 8 schematically shows the relationship between the thickness of a resin substrate on which a recess and projection is formed, a metal deposition film, and a release layer.

In the roller type resin mold for imprinting, as shown in FIG. 6, a mold having the same structure as that of the aforementioned resin mold for imprinting is wound around a roller or the like, with the recessed and projected surface facing outside.

The roller type resin mold for imprinting preferably has a flexible structure in which the mold having three layers or four layers has a thickness of 30 to 300 μm.

2. Method for Producing the Resin Mold for Imprinting

A method for producing the resin mold for imprinting is described with reference to Figures.

In the Figures, the same marks are used for the same structures as those in FIGS. 1 and 2.

A method for producing the resin mold for imprinting having a three-layer structure is described with reference to FIG. 3.

Figure 3:
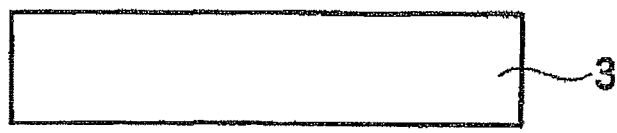
FIG. 3 shows a method for producing a resin mold for imprinting of the present invention having a three-layer structure.
Figure 3:
Figure 3:
Figure 3:
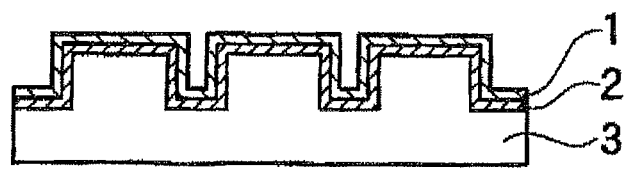

As shown in FIG. 3 (*a*), a substrate composed of a resin is prepared as a resin layer 3.

Then, as shown in FIG. 3 (*b*), by contacting a mold with the resin layer 3, a recessed and projected pattern formed on a surface of the mold is transferred on a surface of the resin layer 3.

Then, as shown in FIG. 3 (*c*), on at least a recessed and projected pattern surface of the resin layer 3, an inorganic material layer 2 with a uniform thickness is formed.

Then, as shown in FIG. 3 (*d*), on at least a recessed and projected pattern surface of the inorganic material layer 2, a release agent layer 1 with a uniform thickness is formed, thereby obtaining the resin mold for imprinting of the present invention.

A method for producing the resin mold for imprinting having a four-layer structure is described with reference to FIG. 4.

Figure 4:
FIG. 4 shows a method for producing a resin mold for imprinting of the present invention having a four-layer structure.
Figure 4:
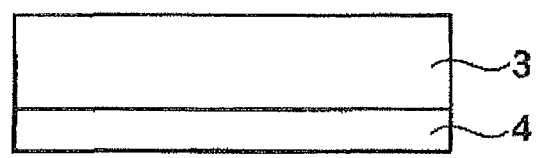
Figure 4:
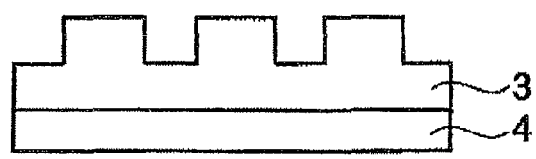
Figure 4:
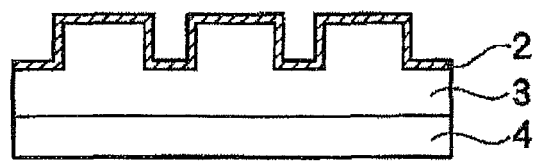
Figure 4:
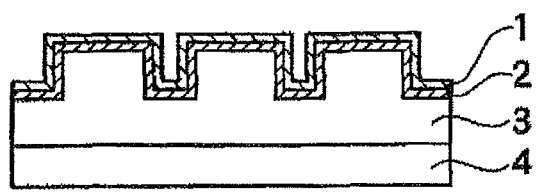

As shown in FIG. 4 (*a*), a substrate 4 is prepared.

Then, as shown in FIG. 4 (*b*), on the substrate 4, a resin layer 3 is formed.

Then, as shown in FIG. 4 (*c*), by contacting a mold with the resin layer 3, a recessed and projected pattern formed on a surface of the mold is transferred on a surface of the resin layer.

Then, as shown in FIG. 4 (*d*), on at least a recessed and projected pattern surface of the resin layer 3, an inorganic material layer 2 with a uniform thickness is formed.

Then, as shown in FIG. 4 (*e*), on at least a recessed and projected pattern surface of the inorganic material layer 2, a release agent layer 1 with a uniform thickness is formed.

Each step will be described hereinafter. A material to constitute each layer of the resin mold for imprinting is the same as that described in the section of the resin mold for imprinting as described above.

<Step (I): A Step of Forming a Resin Layer on a Substrate and/or a Step of Contacting a Mold with a Resin Layer so as to Transfer a Recessed and Projected Pattern Formed on a Surface of the Mold onto a One-Side Surface of the Resin Layer>

(a) Formation of the Resin Layer

In the case of the resin mold for imprinting having a three-layer structure, instead of the step of forming a resin layer, a substrate composed of a resin is prepared as a resin layer. At this time, preferred examples of the substrate composed of a resin include polymethyl methacrylate, polycarbonate and polycycloolefin, which have a suitable hardness endurable to pressure.

In the case of the resin mold for imprinting having a four-layer structure, at first, a substrate is prepared. A resin to form a resin layer on the substrate is optionally diluted with an organic solvent or the like, and coated on the substrate by means of e.g., spin coating, spray coating, bar coating, lip coating, and slit coating. Then, the coated resin is dried, optionally using a hot plate or the like, thus forming a layer having a thickness of preferably 50 nm to 30 μm, more preferably 50 nm to 10 μm.

(b) Formation of Form (Pattern) on the Resin Layer Surface

On the surface of the resin layer, a surface form (pattern) of a mold, such as quartz, a metal and silicon, used for common imprinting, is transferred (imprinted). The surface form (pattern) of the mold is not particularly limited, but preferably has a cycle of 10 nm to 50 μm, a depth of 10 nm to 100 μm, a transfer surface of 1.0 to $1.0 \times 10^6$ mm$^2$; more preferably has a cycle of 20 nm to 20 μm, a depth of 50 nm to 1 μm, a transfer surface of 1.0 to $0.25 \times 10^6$ mm$^2$, in which case sufficient pattern can be formed on the resin layer.

As transferring (imprinting), when the resin layer is composed of a thermoplastic resin or a thermosetting resin, heat imprinting is carried out, and when the resin layer is composed of a photo-curable resin, photo-imprinting is carried out.

The heat imprinting can be performed through a common operation employed for heat imprinting into thermoplastic resins or thermosetting resins, but a preferred operation is, for example, such that on a resin heated to a glass transition temperature (Tg) or higher, a mold is pressed at a pressing pressure of 0.5 to 50 MPa by retaining the mold for 10 to 600 seconds, and then the resin is cooled to a temperature of the glass transition temperature (Tg) or lower, and the mold is detached from the resin layer.

The photo-imprinting can be performed through a common operation employed for photo-imprinting into photo-curable resins, but a preferred operation is, for example, such that on the photo-curable resin, a mold is pressed at a pressing pressure of 0.1 to 5 MPa by retaining the mold for 30 to 600 seconds, and ultraviolet ray is applied, and then the mold is detached from the resin layer.

<Step II: Step of Forming an Inorganic Material Layer with a Uniform Thickness on at Least a Recessed and Projected Pattern Surface of the Resin Layer>

On at least a surface form of the resin layer, a film of an inorganic material or an inorganic oxide with a uniform thickness having a thickness of preferably 0.5 to 100 nm, more preferably 0.5 to 20 nm, most preferably 1 to 10 nm, is formed by common film formation means such as the deposition or the sputtering of an inorganic material or an inorganic oxide.

<Step III: Step of Forming a Release Agent Layer with a Uniform Thickness on at Least a Recessed and Projected Pattern Surface of the Inorganic Material Layer>

On at least a surface form of the inorganic material layer, the release agent is coated by common means such as dip coating, spin coating, deposition and spraying. The release agent may be diluted with an organic solvent dissolving the release agent before use.

After the coating operation as described above, the release agent coating surface is preferably subjected to rinsing treatment using a fluorine-based solvent such as perfluorohexane. The rinsing treatment is preferred to provide the release agent layer with a uniform thickness, but may not be carried out when the release agent layer retains a uniform thickness in the operation of coating the release agent.

In this step, a release agent layer having a thickness of preferably 0.5 to 20 nm, more preferably 0.5 to 10 nm, most preferably 0.5 to 5 nm, is formed.

3. Method for Using the Resin Mold for Imprinting (1) Usual Use Method

The resin mold for imprinting of the present invention is used suitably for the imprinting into a thermoplastic resin, a thermosetting resin or a photo-curable resin; and more preferably is used for the imprinting into a photo-curable resin. An embodiment of a method for using the resin mold for imprinting is described with reference to FIG. 5.

Figure 5:
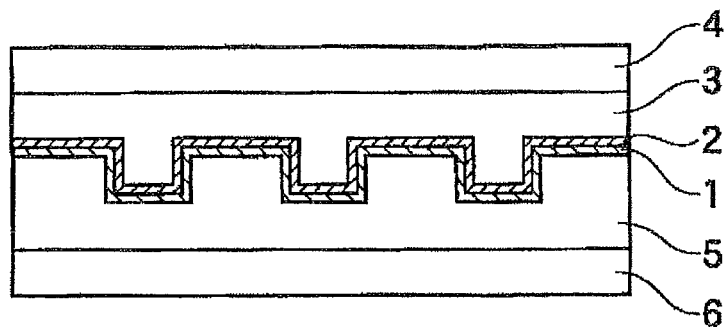
FIG. 5 shows a method for using a resin mold for imprinting of the present invention.
Figure 5:
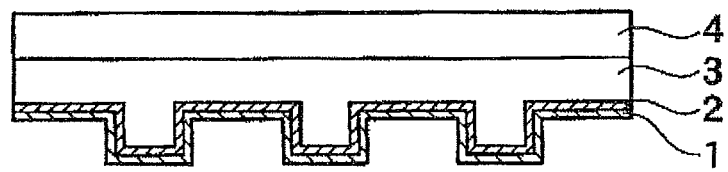
Figure 5:
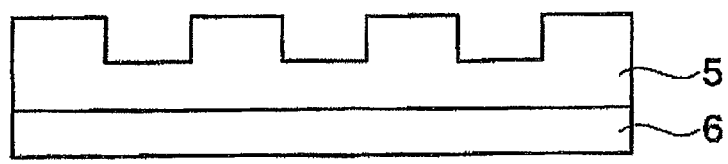

As shown in FIG. 5 (a), the resin mold for imprinting of the present invention is contacted with a surface of a resin 5.

Then, as shown in FIG. 5 (b), the resin mold for imprinting of the present invention is released, thereby obtaining a resin 5 provided with a form on the surface.

<Step of Contacting the Resin Mold for Imprinting on a Surface of a Resin>

The resin 5 to be subjected to imprinting is usually any one of a thermoplastic resin, a thermosetting resin and a photo-curable resin, and is usually present on a substrate 6.

As the substrate 6, any substrate can be used without any limitation as long as being employed for common imprinting, with examples thereof including a resin, glass, silicon, sapphire, gallium nitride, carbon and silicon carbide.

When using thermoplastic resins or thermosetting resins, a common operation employed for heat imprinting into thermoplastic resins or thermosetting resins can be performed, but an example of a preferred operation is such that the mold is contacted, at a pressing pressure of 0.5 to 50 MPa, with a resin heated to a glass transition temperature (Tg) or higher, and the mold is pressed by retaining the mold for 10 to 600 seconds.

When using photo-curable resins, a common operation employed for photo-imprinting into photo-curable resins can be performed, but an example of a preferred operation is such that the mold is contacted with the resin at a pressing pressure of 0.1 to 5 MPa, and the mold is pressed by retaining the mold for 30 to 600 seconds, and then ultraviolet ray is applied.

The photo-imprinting for the photo-curable resin does not require a pressing pressure as large as that required in heat imprinting, and thus, for the photo-imprinting into a photo-curable resin, various embodiments of the resin mold for imprinting of the present invention, for example, a flexible embodiment, such as the resin mold for imprinting using a film or the like as a substrate, can be used suitably.

As the photo-curable resin, a common photo-curable resin can be used without any limitation.

<Step of Releasing the Resin Mold for Imprinting from a Resin>

When using the thermoplastic resin or thermosetting resin, the resin is cooled to a glass transition temperature (Tg) or lower, and then the mold is pulled apart from the resin layer.

When using the photo-curable resin, the mold is pulled apart from the resin layer.

(2) Method for Using a Roller Type Resin Mold for Imprinting

The resin mold for imprinting of the present invention can be used also as a roller type resin mold for imprinting, which is used after the resin mold for imprinting is wound around a roller or the like.

The use of the roller type resin mold for imprinting is suited for the imprinting into the photo-curable resin. As shown in FIG. 6, in this use, the step of contacting the resin mold for imprinting with the surface of the resin comprises the steps of pressing the resin mold for imprinting, wound around a roller, on the surface of the resin and applying an ultraviolet ray.

4. Use

The resin mold for imprinting of the present invention is used for the imprinting into a thermoplastic resin, a thermosetting resin, or a photo-curable resin.

Individual products obtained from resins subjected to imprinting can be used for a semiconductor material, an optical element, a prism, a microlens, recording media, holography, micro-machine, biology, environment, a semiconductor, a LED and an electronic material such as a hard disk.

When the resin mold for imprinting of the present invention has a pattern form, on the surface, having a cycle of 20 nm to 500 nm, preferable uses are, for example, semiconductor materials, media, and optical elements. When the resin mold for imprinting of the present invention has a pattern form, on the surface, having a cycle of 200 nm to 20 μm, preferable uses are, for example, prisms and microlenses.

When the resin mold for imprinting of the present invention is a roller type resin mold for imprinting, continuous molding is possible, and preferable uses are, for example, microlenses and optical performance films such as anti-reflection films.

EXAMPLES

The present invention will be described in detail with reference to Examples, but the present invention shall not be limited by these Examples.

In the present specification and Examples, individual values were measured by the following measurement methods.

<Weight Average Molecular Weight Mw>

The weight average molecular weight was obtained in terms of standard polystyrene measured by gel permeation chromatography (device: HLC-8220GPC manufactured by Toso Corporation, solvent: tetrahydrofuran (THF)).

<Thickness of a Resin Layer>

A distance between a bottom surface of the resin layer and the highest surface of the recessed and projected pattern surface of the resin layer was defined as a thickness of the resin layer.

<Thickness of an Inorganic Material Layer>

Arbitral five points of the surface were measured using a film thickness measurement instrument (model: F20, manufactured by Filmmetrics, Inc.) and an average of the measured values was defined as a thickness of the oxide film layer. The uniformity of the thickness was checked from the standard deviation of the five points.

<Thickness of a Release Agent Layer>

Arbitral five points of the surface were measured using a film thickness measurement instrument (model: F20, manufactured by Filmmetrics, Inc.) and an average of the measured values was defined as a thickness of the release agent layer. The uniformity of the thickness was checked from the standard deviation of the five points.

<Contact Angle of a Surface of the Release Agent Layer with Respect to Pure Water>

About 1 μL of a micro water droplet was placed still on a surface of a specimen, and the specimen was subjected to measurement in air using KYOWA CONTACT-ANGLE METER CA-D type manufactured by Kyowa Interface Science Co., Ltd. The measurement conditions were in accordance with JISR3257.

A change ratio was calculated as follows:

(Contact angle of a release agent layer before imprinting−Contact angle of a release agent layer after imprinting)/Contact angle of a release agent layer before imprinting×100(%)

<Surface Form (Pattern)>

The cycle and line width were evaluated with SEM (S-4800 manufactured by Hitachi High-Technologies), and the depth (height) was evaluated with AFM (L-trace manufactured by SII Nano Technology Inc.).

<Imprinting Result>

Macro evaluation: a transfer surface formed on a resin subjected to imprinting was observed with an optical microscope (ELIPSE LV100 manufactured by Nicon Corporation) at a magnification of 20, and the presence of the transfer-adhering of the resin onto the mold was observed.

AA: resin transfer-adhering was absent.
BB: resin transfer-adhering was present.

SEM (cycle): a pattern formed on a resin subjected to imprinting was evaluated with SEM, on the basis of a SEM measurement result of a pattern formed on the surface of the resin mold for imprinting, to see the presence of change under the following criteria.

AA: a change ratio was less than 10 nm.
BB: a change ratio was not less than 10 nm.

AFM (depth): a pattern formed on a resin subjected to imprinting was evaluated with AFM, on the basis of an AFM measurement result of a pattern formed on the surface of the resin mold for imprinting, to see the presence of change under the following criteria.

AA: a change ratio was less than 10 nm.
BB: a change ratio was not less than 10 nm.

Example 1

(1) Production of a Resin (Preparation of a Resin for a Resin Mold (PMMA))

A flask equipped with a stirring device, a nitrogen-introducing tube, a thermometer, and a reflux cooling tube was charged with 100 parts by weight of methyl methacrylate (product name: LIGHT ESTER M, manufactured by Kyoeisha Chemical Co., Ltd.) and 100 parts by weight of toluene.

Then, while introducing a nitrogen gas (0.3 L/min) into the flask, the content in the flask was heated to 80° C., and 0.5 part by weight of dimethyl 2,2'-azobis(2-methylpropionate) (product name: V-601, manufactured by Wako Pure Chemical Industries, Ltd.) was added as an initiator. The mixture was kept for 8.0 hours at 80° C.

Then, the supply of the nitrogen gas was terminated, and 100 parts by weight of toluene was added thereby lowering the temperature to terminate the reaction. A resin for a resin mold (a resin for a resin layer (PMMA)) was thus obtained. A molecular weight of the resin obtained is indicated in Table 1.

(2) Formation of a Resin Layer (Spin Coating of the Resin on a Substrate)

The resin for a resin mold (the resin for a resin layer (PMMA)) obtained in (1) was diluted ten times with toluene, and was spin coated on a polysulfone film (PSF) (product name: SUMILITE™ FS-1200, manufactured by Sumitomo Bakelite Co., Ltd., thickness: 0.12 mm) substrate. Then, the coated resin was dried at 130° C. for 15 minutes using a hot plate, thereby preparing a resin layer having a film thickness of 1.2 μm (the thickness was 8 times as large as the height of the form of a master mold to be used) on the substrate. A resin thickness was defined as an average of thicknesses measured at arbitral five points of the surface using a film thickness measurement instrument (model: F20, manufactured by Filmmetrics, Inc.).

(3) Formation of a Pattern on a Surface of the Resin Layer

Using ST-50 manufactured by Toshiba Machine Co., Ltd., the laminate consisting of the film substrate and the resin layer was heated to 140° C., and on a surface of the resin layer, a master mold (a quartz mold which had been subjected to release treatment, a transfer surface of 576 mm$^2$, 150 nmL/S, a cycle of 300 nm, a depth of 150 nm, a linear form L/S (Line and Space)) was pressed, thereby carrying out heat imprinting at 140° C. The heat imprinting was carried out at a pressing pressure of 20 MPa at a retention time of 5 minutes. Then, the laminate was cooled to a temperature of not higher than 80° C., and the master mold was detached, thereby obtaining a resin layer having a pattern formed on the one-side surface (transfer surface of 576 mm$^2$, 150 mL/S, a cycle of 300 nm, a depth of 150 nm).

(4) Formation of an Inorganic Material Layer

On a surface on which the pattern was formed of the resin layer obtained in (3), SiO$_2$ was deposited with the resin subjected to rotation and revolution, thereby forming an oxide film coating having a thickness of 3.8 nm serving as an inorganic material layer. As the deposition, vacuum deposition was carried out at room temperature for about 1 minute using an optical thin film coater (OPTORUN OMC-1100). After the deposition, the surface form of the inorganic material layer was visually observed to have neither cracks nor defect.

(5) Formation of a Release Agent Layer

The laminate consisting of the inorganic material layer, the resin layer and the substrate obtained in (4) was soaked for 1 minute in a fluorine-based release agent liquid (product name: OPTOOL HD-1100, manufactured by Daikin Industries, Ltd.), took out from the liquid, and was allowed to stand still for 1 hour in humid heated environment of 70° C. and 90%. Then, the laminate was rinsed using a fluorine-based solvent (product name: OPTOOL HD-TH, manufactured by Daikin Industries, Ltd.), and was allowed to stand still for 24 hours in environment of 23° C. and 65%. A resin mold for imprinting in which a release agent layer was formed on the surface of the inorganic material layer was thus obtained.

The surface form of the release agent layer was observed with SEM and AFM to have neither defect nor change (a line width of 150 nm, a cycle of 300 nm, a depth of 150 nm, L/S). A contact angle of the surface of the release agent layer obtained with respect to pure water was measured and found to be 110°. Through the above steps, a resin mold for imprinting as indicated in Table 1 was produced.

Using the resin mold for imprinting produced, the following imprinting was carried out.

(6) Imprinting Using the Resin Mold for Imprinting

On the resin mold for imprinting, 0.2 mL of a photocurable resin (product name: PAK-02, manufactured by Toyo Gosei Co., Ltd.) was dropped, and thereon, a polycarbonate film (product name: LEXAN, manufactured by Asahi Glass Co., Ltd.) was placed. Then, pressing was carried out at 0.4 MPa for 1 minute using a photo-nanoimprinting device (manufactured by Engineerng System Co., Ltd.). Then, ultraviolet ray was applied (10 mW/cm$^2$) for 2 minutes. Then, the resin mold for imprinting was detached.

Whether the resin mold for imprinting had a defect such as the peeling of the release agent layer, after the imprinting, was visually observed, and further, a contact angle was measured. Further, a surface form of the resin subjected to imprinting was observed with SEM and AFM, and was found to have a pattern having a line width of 150 nm, a cycle of 300 nm, a depth of 150 nm, and L/S. The result is shown in the table as imprinting result.

Using the resin mold obtained, continuous photo-imprinting of 20 shots was carried out. The imprinting was achieved without any problem.

Example 2

A resin mold for imprinting was prepared in the same manner as in Example 1, except that in Example 1, (1) and (2) were not carried out, and in (3), using a polymethyl methacrylate (PMMA) plate (product name: ACRYLITE EX, manufactured by Mitsubishi Rayon Co., Ltd., thickness: 3.0 mm) instead of using the laminate consisting of the resin layer and the PSF film, heat imprinting was carried out onto the surface of the PMMA plate at a heat imprinting temperature of 160° C., at a pressing pressure of 5 MPa, and at a retention time of 30 seconds. Using the resin mold for imprinting obtained, imprinting was carried out in the same manner as in Example 1. The resin mold for imprinting obtained and the result of the imprinting are shown in Table 5.

Using the resin mold obtained, continuous photo-imprinting of 20 shots was carried out. The imprinting was achieved without any problem.

Example 3

A resin mold for imprinting was prepared in the same manner as in Example 1, except that in Example 1, the thickness of the resin in (2) was 0.4 μm, and the master mold in (3) was changed to a quartz mold which had been subjected to release treatment (a transfer surface of 576 mm$^2$, 25 nmL/S, a cycle of 50 nm, a depth of 50 nm, a linear form L/S). Using the resin mold for imprinting obtained, imprinting was carried out in the same manner as in Example 1. The resin mold for imprinting obtained and the result of the imprinting are shown in Table 1.

Using the resin mold obtained, continuous photo-imprinting of 20 shots was carried out. The imprinting was achieved without any problem.

Example 4

A resin mold for imprinting was prepared in the same manner as in Example 1, except that in Example 1, the master mold in (3) was changed to a quartz mold which had been subjected to release treatment (a transfer surface of 576 mm$^2$, 75 nmL/S, a cycle of 150 nm, a depth of 150 nm, a linear form L/S). Using the resin mold for imprinting obtained, imprinting was carried out in the same manner as in Example 1. The resin mold for imprinting obtained and the result of the imprinting are shown in Table 1.

Using the resin mold obtained, continuous photo-imprinting of 20 shots was carried out. The imprinting was achieved without any problem.

Example 5

A resin mold for imprinting was prepared in the same manner as in Example 1, except that in Example 1, the master mold in (3) was changed to a quartz mold which had been subjected to release treatment (a transfer surface of 576 mm², 10,000 nmL/S, a cycle of 20,000 nm, a depth of 300 nm, a linear form L/S). Using the resin mold for imprinting obtained, imprinting was carried out in the same manner as in Example 1. The resin mold for imprinting obtained and the result of the imprinting are shown in Table 1.

Using the resin mold obtained, continuous photo-imprinting of 20 shots was carried out. The imprinting was achieved without any problem.

Example 6

A resin mold for imprinting was prepared in the same manner as in Example 1, except that in Example 1, the master mold in (3) was changed to a quartz mold which had been subjected to release treatment (a transfer surface of 576 mm², a hole diameter of 200 nm, a cycle of 400 nm, a depth of 200 nm, a column form). Using the resin mold for imprinting obtained, imprinting was carried out in the same manner as in Example 1. The resin mold for imprinting obtained and the result of the imprinting are shown in Table 1.

Using the resin mold obtained, continuous photo-imprinting of 20 shots was carried out. The imprinting was achieved without any problem.

Example 7

A resin mold for imprinting was prepared in the same manner as in Example 1, except that in Example 1, the master mold in (3) was changed to a quartz mold which had been subjected to release treatment (a transfer surface of 576 mm², a cycle of 300 nm, a depth of 300 nm, a moth eye form). Using the resin mold for imprinting obtained, imprinting was carried out in the same manner as in Example 1. The resin mold for imprinting obtained and the result of the imprinting are shown in Table 1.

Using the resin mold obtained, continuous photo-imprinting of 20 shots was carried out. The imprinting was achieved without any problem.

Example 8

A resin mold for imprinting was prepared in the same manner as in Example 1, except that in Example 1, the thickness of the resin in (2) was 6.4 μm, and the master mold in (3) was changed to a quartz mold which had been subjected to release treatment (a transfer surface of 576 mm², a hole diameter of 10,000 nm, a cycle of 20,000 nm, a depth of 4,000 nm, a microlens form). Using the resin mold for imprinting obtained, imprinting was carried out in the same manner as in Example 1. The resin mold for imprinting obtained and the result of the imprinting are shown in Table 1.

Using the resin mold obtained, continuous photo-imprinting of 20 shots was carried out. The imprinting was achieved without any problem.

Example 9

A resin mold for imprinting was prepared in the same manner as in Example 1, except that in (4) of Example 1, on the surface of the resin layer, $ZrO_2$ was deposited instead of $SiO_2$ so as to form a film of 3.2 nm serving as an inorganic material layer. Using the resin mold for imprinting obtained, imprinting was carried out in the same manner as in Example 1. The resin mold for imprinting obtained and the result of the imprinting are shown in Table 2.

Using the resin mold obtained, continuous photo-imprinting of 20 shots was carried out. The imprinting was achieved without any problem.

Example 10

A resin mold for imprinting was prepared in the same manner as in Example 1, except that in (4) of Example 1, on the surface of the resin layer, ITO was deposited instead of $SiO_2$ so as to form a film of 2.8 nm serving as an inorganic material layer. Using the resin mold for imprinting obtained, imprinting was carried out in the same manner as in Example 1. The resin mold for imprinting obtained and the result of the imprinting are shown in Table 2.

Using the resin mold obtained, continuous photo-imprinting of 20 shots was carried out. The imprinting was achieved without any problem.

Example 11

A resin mold for imprinting was prepared in the same manner as in Example 1, except that in (4) of Example 1, on the surface of the resin layer, $TiO_2$ was deposited instead of $SiO_2$ so as to form a film of 2.2 nm serving as an inorganic material layer. Using the resin mold for imprinting obtained, imprinting was carried out in the same manner as in Example 1. The resin mold for imprinting obtained and the result of the imprinting are shown in Table 2.

Using the resin mold obtained, continuous photo-imprinting of 20 shots was carried out. The imprinting was achieved without any problem.

Example 12

A resin mold for imprinting was prepared in the same manner as in Example 1, except that in (4) of Example 1, on the surface of the resin layer, silicon, instead of $SiO_2$, was deposited at room temperature by low-temperature film forming apparatus (ICP-CVD) method with rotation and revolution, so as to form an amorphous-silicon (α-Si) film serving as an inorganic material layer. Using the resin mold for imprinting obtained, imprinting was carried out in the same manner as in Example 1. The resin mold for imprinting obtained and the result of the imprinting are shown in Table 2.

Using the resin mold obtained, continuous photo-imprinting of 20 shots was carried out. The imprinting was achieved without any problem.

Example 13

A resin mold for imprinting was prepared in the same manner as in Example 1, except that in (4) of Example 1, on the surface of the resin layer, $SiO_x$ (a mixture wherein x is 1 to 5), instead of $SiO_2$, was sputtered at room temperature with rotation and revolution so as to form a coating film serving as an inorganic material layer. Using the resin mold for imprinting obtained, imprinting was carried out in the same manner as in Example 1. The resin mold for imprinting obtained and the result of the imprinting are shown in Table 2.

Using the resin mold obtained, continuous photo-imprinting of 20 shots was carried out. The imprinting was achieved without any problem.

Example 14

A resin mold for imprinting was prepared in the same manner as in Example 1, except that in (4) of Example 1, on the surface of the resin layer, $SiO_2$ and $ZrO_2$, instead of $SiO_2$, were simultaneously sputtered at room temperature with rotation and revolution so as to form a coating film serving as an inorganic material layer. Using the resin mold for imprinting obtained, imprinting was carried out in the same manner as in Example 1. The resin mold for imprinting obtained and the result of the imprinting are shown in Table 2.

Using the resin mold obtained, continuous photo-imprinting of 20 shots was carried out. The imprinting was achieved without any problem.

Example 15

A resin mold for imprinting was prepared in the same manner as in Example 1, except that in (4) of Example 1, with rotation and revolution, on the surface of the resin layer, $SiO_2$ was deposited and then $ZrO_2$ was deposited so as to form an inorganic material layer composed of two layers. Using the resin mold for imprinting obtained, imprinting was carried out in the same manner as in Example 1. The resin mold for imprinting obtained and the result of the imprinting are shown in Table 2.

Using the resin mold obtained, continuous photo-imprinting of 20 shots was carried out. The imprinting was achieved without any problem.

Example 16

A resin mold for imprinting was prepared in the same manner as in Example 1, except that in (5) of Example 1, the release agent liquid was changed to tridecafluoro(1,1,2,2) tetrahydrooctyl trichlorosilane. Using the resin mold for imprinting obtained, imprinting was carried out in the same manner as in Example 1. The resin mold for imprinting obtained and the result of the imprinting are shown in Table 3.

Using the resin mold obtained, continuous photo-imprinting of 20 shots was carried out. The imprinting was achieved without any problem.

Example 17

A resin mold for imprinting was prepared in the same manner as in Example 1, except that in (5) of Example 1, the release agent liquid was changed to perfluorohexanoic acid. Using the resin mold for imprinting obtained, imprinting was carried out in the same manner as in Example 1. The resin mold for imprinting obtained and the result of the imprinting are shown in Table 3.

Using the resin mold obtained, continuous photo-imprinting of 20 shots was carried out. The imprinting was achieved without any problem.

Example 18

A resin mold for imprinting was prepared in the same manner as in Example 1, except that in (5) of Example 1, the release agent liquid was changed to 1H,1H-tridecafluoroheptylamine. Using the resin mold for imprinting obtained, imprinting was carried out in the same manner as in Example 1. The resin mold for imprinting obtained and the result of the imprinting are shown in Table 3.

Using the resin mold obtained, continuous photo-imprinting of 20 shots was carried out. The imprinting was achieved without any problem.

Example 19

A resin mold for imprinting was prepared in the same manner as in Example 1, except that in (5) of Example 1, the release agent liquid was changed to methyl triisocyanate silane (product name: Orgatics SI-310, manufactured by Matsumoto Trading Co., Ltd.). Using the resin mold for imprinting obtained, imprinting was carried out in the same manner as in Example 1. The resin mold for imprinting obtained and the result of the imprinting are shown in Table 3.

Using the resin mold obtained, continuous photo-imprinting of 20 shots was carried out. The imprinting was achieved without any problem.

Example 20

A resin mold for imprinting was prepared in the same manner as in Example 1, except that in (1) of Example 1, 100 parts by weight of methyl methacrylate was replaced by 100 parts by weight of styrene (product name: styrene monomer, manufactured by Idemitsu Kosan Co., Ltd.). Using the resin mold for imprinting obtained, imprinting was carried out in the same manner as in Example 1. The resin mold for imprinting obtained and the result of the imprinting are shown in Table 4.

Using the resin mold obtained, continuous photo-imprinting of 20 shots was carried out. The imprinting was achieved without any problem.

Example 21

Instead of carrying out (1) and (2) of Example 1, the following operation was carried out to prepare a laminate consisting of a resin layer and a substrate.

Into 100 parts by weight of an epoxy resin (product name: OGSOL EG, manufactured by Osaka Gas Chemicals Co., Ltd.), 5 parts by weight of an acid anhydride based curing agent (product name: RIKACID MH-700, manufactured by New Japan Chemical Co., Ltd.) was added, and the mixture was sufficiently stirred to form a composition. The composition was diluted ten times with toluene, and was spin coated on a polysulfone film (PSF) (product name: SUMILITE™ FS-1200, manufactured by Sumitomo Bakelite Co., Ltd., thickness: 0.12 mm) substrate. Then, the laminate obtained was heated at 140° C. for 3 hours using a hot plate, thereby curing the epoxy resin to provide a laminate consisting of the substrate and the resin layer.

A resin mold for imprinting was prepared in the same manner as in (3) to (5) of Example 1, except that the above laminate consisting of the substrate and the resin layer was used. Using the resin mold for imprinting obtained, imprinting was carried out in the same manner as in Example 1. The resin mold for imprinting obtained and the result of the imprinting are shown in Table 4.

Using the resin mold obtained, continuous photo-imprinting of 20 shots was carried out. The imprinting was achieved without any problem.

Example 22

Instead of carrying out (1) to (3) of Example 1, the following operation was carried out to prepare a laminate consisting of a resin layer having a pattern form on the surface and a substrate.

An acrylic based photo-curable resin PAK-02 (manufactured by Toyo Gosei Co., Ltd.) was spin coated on a polysulfone film (product name: SUMILITE™ FS-1200, manufactured by Sumitomo Bakelite Co., Ltd.).

On a surface of the resin on the film substrate, a master mold (a quartz mold which had been subjected to release treatment, a transfer surface of 576 mm², 150 nmL/S, a cycle of 300 nm, a depth of 150 nm) was pressed at 0.4 MPa for 1 minute using a photo-nanoimprinting device (manufactured by Engineering System Co., Ltd.). This was followed by the application of ultraviolet ray (10 mW/cm²) for 2 minutes. Then, the quartz mold was detached, thereby obtaining a resin layer having a pattern formed on the one-side surface (transfer surface of 576 mm², 150 mL/S, a cycle of 300 nm, a depth of 150 nm).

A resin mold for imprinting was prepared in the same manner as in (4) to (5) of Example 1, except that the above resin layer having a pattern form on the surface was used. Using the resin mold for imprinting obtained, imprinting was carried out in the same manner as in Example 1. The resin mold for imprinting obtained and the result of the imprinting are shown in Table 4.

Using the resin mold obtained, continuous photo-imprinting of 20 shots was carried out. The imprinting was achieved without any problem.

Example 23

A resin mold for imprinting was prepared in the same manner as in Example 1, except that (1) and (2) of Example 1 were not carried out, and a cycloolefin polymer (COP) plate (product name: ZEONEX 2T, manufactured by Zeon Corporation, thickness: 2 mm) was a substitute for the laminate consisting of the resin layer and the substrate, and further in (3) of Example 1, heat imprinting was carried out on the surface of the cycloolefin polymer plate at a heat imprinting temperature of 150° C., at a pressing pressure of 5 MPa, and at a retention time of 30 seconds. Using the resin mold for imprinting obtained, imprinting was carried out in the same manner as in Example 1. The resin mold for imprinting obtained and the result of the imprinting are shown in Table 5.

Using the resin mold obtained, continuous photo-imprinting of 20 shots was carried out. The imprinting was achieved without any problem.

Example 24

A resin mold for imprinting was prepared in the same manner as in Example 1, except that (1) and (2) of Example 1 were not carried out, and a polycarbonate (PC) film (product name: LEXAN, manufactured by Asahi Glass Co., Ltd., thickness: 1 mm) was a substitute for the laminate consisting of the resin layer and the substrate, and further in (3) of Example 1, heat imprinting was carried out on the surface of the polycarbonate film at a heat imprinting temperature of 170° C., at a pressing pressure of 5 MPa, and at a retention time of 30 seconds. Using the resin mold for imprinting obtained, imprinting was carried out in the same manner as in Example 1. The resin mold for imprinting obtained and the result of the imprinting are shown in Table 5.

Using the resin mold obtained, continuous photo-imprinting of 20 shots was carried out. The imprinting was achieved without any problem.

Example 25

A resin mold for imprinting was prepared in the same manner as in Example 1, except that (1) and (2) of Example 1 were not carried out, and a polyethylene terephthalate (PET) film (product name: Teijin™ Tetron™ film, manufactured by Teijin Limited, thickness: 0.1 mm) was a substitute for the laminate consisting of the resin layer and the substrate, and further in (3) of Example 1, heat imprinting was carried out on the surface of the polyethylene terephthalate film at a heat imprinting temperature of 170° C., at a pressing pressure of 5 MPa, and at a retention time of 30 seconds. Using the resin mold for imprinting obtained, imprinting was carried out in the same manner as in Example 1. The resin mold for imprinting obtained and the result of the imprinting are shown in Table 5.

Using the resin mold obtained, continuous photo-imprinting of 20 shots was carried out. The imprinting was achieved without any problem.

Example 26

A resin mold for imprinting was prepared in the same manner as in Example 1, except that in (2) of Example 1, the substrate was changed from the polysulfone film to soda glass (manufactured by Asahi Glass Co., Ltd., thickness: 1.1 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 27

A resin mold for imprinting was prepared in the same manner as in Example 1, except that in (2) of Example 1, the substrate was changed from the polysulfone film to a silicon wafer (manufactured by Covalent Materials Corporation, grade used: polished wafer, thickness: 0.5 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 28

A resin mold for imprinting was prepared in the same manner as in Example 1, except that in (2) of Example 1, the substrate was changed from the polysulfone film to a sapphire substrate (manufactured by ORBE PIONEER LTD., semiconductor grade, thickness: 0.5 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 29

A resin mold for imprinting was prepared in the same manner as in Example 1, except that in (2) of Example 1, the substrate was changed from the polysulfone film to a gallium nitride substrate (manufactured by Sumitomo Electric Industries, Ltd., one-side specular finishing, thickness: 0.4 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 30

A resin mold for imprinting was prepared in the same manner as in Example 1, except that in (2) of Example 1, the substrate was changed from the polysulfone film to a polyethylene terephthalate (PET) film (product name: Teijin™ Tetron™ film, manufactured by Teijin Limited, thickness: 0.1 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 31

A resin mold for imprinting was prepared in the same manner as in Example 1, except that in (2) of Example 1, the substrate was changed from the polysulfone film to a polycarbonate (PC) film (product name: LEXAN, manufactured by Asahi Glass Co., Ltd., thickness: 0.12 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 32

A resin mold for imprinting was prepared in the same manner as in Example 1, except that in (2) of Example 1, the substrate was changed from the polysulfone film to a polyethylene naphthalate (PEN) film (product name: Teonex, manufactured by Teijin Chemicals Limited, thickness: 0.12 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 33

A resin mold for imprinting was prepared in the same manner as in Example 1, except that in (2) of Example 1, the substrate was changed from the polysulfone film to a polyimide film (product name: AURUM film, manufactured by Mitsui Chemicals, Inc., thickness: 0.3 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 34

A resin mold for imprinting was prepared in the same manner as in Example 1, except that in (2) of Example 1, the substrate was changed from the polysulfone film to a polymethyl methacrylate (PMMA) film (product name: ACRYPLEN, manufactured by Mitsubishi Rayon Co., Ltd., thickness: 0.12 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 35

A resin mold for imprinting was prepared in the same manner as in Example 1, except that in (2) of Example 1, the substrate was changed from the polysulfone film to glassy carbon (GC) (grade: SA-1, manufactured by Tokai Carbon Co., Ltd., thickness: 1.0 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 36

A resin mold for imprinting was prepared in the same manner as in Example 1, except that in (2) of Example 1, the substrate was changed from the polysulfone film to a silicon carbide (SiC) wafer (grade: 6H N-type, manufactured by TankeBlue Semiconductor Co., Ltd., thickness: 0.43 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 37

A resin mold for imprinting was prepared in the same manner as in Example 1, except that in (2) of Example 1, the substrate was changed from the polysulfone film to a polymethyl methacrylate film (product name: ACRYPLEN, manufactured by Mitsubishi Rayon Co., Ltd., thickness: 0.12 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 38

A resin mold for imprinting was prepared in the same manner as in Example 1, except that in (2) of Example 1, the substrate was changed from the polysulfone film to a PET (polyethylene terephthalate) film (product name: Teijin™ Tetron™ film, manufactured by Teijin Limited, thickness: 0.25 mm). Using the resin mold for imprinting obtained, imprinting was carried out in the same manner as in Example 1. The resin mold for imprinting obtained and the result of the imprinting are shown in Table 6.

Using the resin mold obtained, continuous photo-imprinting of 20 shots was carried out. The imprinting was achieved without any problem.

Example 39

Using the resin mold for imprinting of Example 1, imprinting was carried out as follows instead of carrying out (6) of Example 1.

As a resin for a resin layer, a commercial cyclohexyl methacrylate (CHMA) (product name: LIGHT ESTER CH, manufactured by Kyoeisha Chemical Co., Ltd.) was spin coated on a glass substrate to form a laminate consisting of the substrate and the resin. The laminate was heated to 130° C., thereby preparing a resin layer to be subjected to imprinting.

On the surface of the resin layer to be subjected to imprinting, the resin mold for imprinting (a transfer surface of 576 mm$^2$, 150 nmL/S) prepared in Example 1 was pressed, thereby carrying out heat imprinting at 100° C. In the heat imprinting, the pressing pressure was 20 MPa, and the retention time was 5 minutes. Then, the laminate consisting of the resin layer subjected to imprinting and the substrate was cooled to a temperature of not higher than 80° C., and the resin mold was detached. The presence of the peeling or the like of the release agent layer of the resin mold for imprinting, after imprinting, was visually observed, and a contact angle was measured. The surface form of the resin subjected to imprinting was observed with SEM and AFM, and was found to have a pattern having a line width of 150 nm, a cycle of 300 nm, and a depth of 150 nm.

The result is shown in Table 7 as imprinting result.

Using the resin mold obtained, continuous photo-imprinting of 20 shots was carried out. The imprinting was achieved without any problem.

Example 40

Using the resin mold for imprinting of Example 1, imprinting was carried out as follows instead of carrying out (6) of Example 1.

The resin mold for imprinting obtained in Example 1 was wound around a roll of 6 inches in diameter, and the roll was pressed at 1.0 MPa on a polycarbonate film (LEXAN film, thickness: 0.12 mm, manufactured by Asahi Glass Co., Ltd.) coated with a photo-curable resin (product name: PAK-02, manufactured by Toyo Gosei Co., Ltd.), and at such a state, a line was moved (a moving rate of 1 m/min). Then, while moving the line, ultraviolet ray was applied (70 mW/cm$^2$) to cure the resin. Then, the resin mold for imprinting was detached from the roll, and was found to have no defect such as the peeling of the release agent layer.

Along with the visual observation after imprinting of whether the resin mold for imprinting had any defect such as the peeling of the release agent layer, a contact angle was measured. Meanwhile, a surface form of the resin subjected to imprinting was observed with SEM and AFM, and was found to have a pattern having a line width of 150 nm, a cycle of 300 nm and a depth of 150 nm. The result is shown in Table 7 as imprinting result.

Comparative Example 1

(1) to (3) of Example 1 were carried out, thereby preparing a resin mold for imprinting formed from a substrate and a resin layer. Using the resin mold for imprinting obtained, imprinting was carried out in the same manner as in Example 1. The resin mold for imprinting obtained and the result of the imprinting are shown in Table 8.

Comparative Example 2

(1) to (3) and (5) of Example 1 were carried out, thereby preparing a resin mold for imprinting formed from a substrate, a resin layer, and a release agent layer. Using the resin mold for imprinting obtained, imprinting was carried out in the same manner as in Example 1. The resin mold for imprinting obtained and the result of the imprinting are shown in Table 8.

Comparative Example 3

(1) to (4) of Example 1 were carried out, thereby preparing a resin mold for imprinting formed from a substrate, a resin layer, and an inorganic material layer. Using the resin mold for imprinting obtained, imprinting was carried out in the same manner as in Example 1. The resin mold for imprinting obtained and the result of the imprinting are shown in Table 8.

Comparative Example 4

In (1) of Example 1, 40 parts by weight of methyl methacrylate was replaced by 40 parts by weight of perflorooctyl ethyl methacrylate (product name: LIGHT ESTER FM-108, manufactured by Kyoeisha Chemical Co., Ltd.), thereby producing a resin for a resin layer. Then, the same operation as in (2) and (3) of Example 1 was carried out. (4) and (5) of Example 1 were not carried out. A resin mold for imprinting formed from a substrate and a resin layer was thus prepared. Using the resin mold for imprinting obtained, imprinting was carried out in the same manner as in Example 1. The resin mold for imprinting obtained and the result of the imprinting are shown in Table 8.

Comparative Example 5

In (1) of Example 1, 40 parts by weight of methyl methacrylate was replaced by 40 parts by weight of perflorooctyl ethyl methacrylate (product name LIGHT ESTER FM-108, manufactured by Kyoeisha Chemical Co., Ltd.), thereby producing a resin for a resin layer. Then, the same operation as in (2) and (3) of Example 1 was carried out. Then, (4) of Example 1 was not carried out, and (5) of Example 1 was carried out. A resin mold for imprinting formed from a substrate, a resin layer and a release agent layer was thus prepared. Using the resin mold for imprinting obtained, imprinting was carried out in the same manner as in Example 1. The resin mold for imprinting obtained and the result of the imprinting are shown in Table 8.

Reference Example 1

A resin mold for imprinting was prepared in the same manner as in Example 1, except that in (4) of Example 1, the thickness of the SiO$_2$ film layer was changed to 120 nm. Using the resin mold for imprinting obtained, imprinting was carried out in the same manner as in Example 1. As a result, because of the too large thickness of the inorganic material layer, a crack occurred in the deposition in (4). A resin subjected to imprinting had a form reflecting the crack. The resin mold for imprinting obtained and the result of the imprinting are shown in Table 9.

Reference Example 2

A resin mold for imprinting was prepared in the same manner as in Example 1, except that in (4) of Example 1, the thickness of the SiO$_2$ film layer was changed to less than 0.5 nm. Using the resin mold for imprinting obtained, imprinting was carried out in the same manner as in Example 1.

However, because of the too small thickness of the inorganic material layer, the adhesion was not sufficiently retained between the release agent layer formed on the inorganic material layer and the film of the inorganic material layer, increasing the occurrence rate of the micro peeling of the release agent and lowering the imprinting precision.

The resin mold for imprinting obtained and the result of the imprinting are shown in Table 9.

The thickness of the SiO$_2$ film layer was too small to measure, and thus is a calculated value in view of the deposition conditions.

Reference Example 3

A resin mold for imprinting was prepared in the same manner as in Example 1, except that in (5) of Example 1, the thickness of the release agent layer was changed to 21.4 nm. As a result, because of the too large thickness of the release agent layer, there was a change in a pattern form of a resin mold for imprinting obtained (a line width of 160 nm, a cycle of 300 nm, and a depth of 150 nm) relative to the pattern form of the master mold. Using the resin mold for imprinting obtained, imprinting was carried out in the same manner as in Example 1. The resin mold for imprinting obtained and the result of the imprinting are shown in Table 9.

Using the resin mold obtained, continuous photo-imprinting of 20 shots was carried out. The imprinting was achieved without any problem.

However, the surface of the resin subjected to imprinting, when analyzed with FT-IR, was found to have the release agent transferred thereto, presumably because of the too large thickness of the release agent layer.

Reference Example 4

A resin mold for imprinting was prepared in the same manner as in Example 1, except that in (5) of Example 1, the thickness of the release agent layer was changed to less than 0.5 nm. Using the resin mold for imprinting obtained, imprinting was carried out in the same manner as in Example 1. As a result, the too small thickness of the release agent layer decreased the resin releasing efficiency.

The resin mold for imprinting obtained and the result of the imprinting are shown in Table 9.

The thickness of the release agent layer was too small to measure, and thus is a calculated value in view of the treatment conditions.

TABLE 1

| | | Diffference in Mold Form | | | | | | |
|---|---|---|---|---|---|---|---|---|
| | | Ex. 1 | Ex. 3 | Ex. 4 | Ex. 5 | Ex. 6 | Ex. 7 | Ex. 8 |
| Substrate | Type | PSF | PSF | PSF | PSF | PSF | PSF | PSF |
| | Thickness (mm) | 0.12 | 0.12 | 0.12 | 0.12 | 0.12 | 0.12 | 0.12 |
| Resin layer | Type | PMMA | PMMA | PMMA | PMMA | PMMA | PMMA | PMMA |
| | Thickness (μm) | 1.2 | 0.4 | 1.2 | 1.2 | 1.2 | 1.2 | 6.4 |
| | Weight average molecular weight (Mw)(×10$^4$) | 8.3 | 8.3 | 8.3 | 8.3 | 8.3 | 8.3 | 8.3 |
| Inorganic material layer | Film material | SiO$_2$ | SiO$_2$ | SiO$_2$ | SiO$_2$ | SiO$_2$ | SiO$_2$ | SiO$_2$ |
| | Thickness (nm) | 3.8 | 3.2 | 2.6 | 4.6 | 3.8 | 3.2 | 2.6 |
| | Standard deviation of thickness | 0.75 | 0.75 | 0.49 | 0.49 | 0.75 | 0.75 | 0.49 |
| Release agent layer | Release agent | HD-1100 | HD-1100 | HD-1100 | HD-1100 | HD-1100 | HD-1100 | HD-1100 |
| | Thickness (nm) | 3.2 | 4.6 | 3.2 | 2.8 | 3.2 | 4.6 | 3.2 |
| | Standard deviation of thickness | 0.75 | 0.49 | 0.98 | 0.40 | 0.75 | 0.49 | 0.98 |
| | Contact angle with respect to water — Before imprinting (°) | 110 | 110 | 110 | 110 | 110 | 110 | 110 |
| | After imprinting (°) | 108 | 110 | 110 | 110 | 108 | 110 | 110 |
| | Change ratio (%) between before and after imprintings | 1.8 | 0.0 | 0.0 | 0.0 | 1.8 | 0.0 | 0.0 |
| Pattern cycle of Master mold used (nm) | | 300 | 50 | 150 | 20,000 | 400 | 300 | 20,000 |
| Form of Master mold used | | L/S | L/S | L/S | L/S | column | moth eye | lens |
| Imprinting result | Macro evaluation | AA | AA | AA | AA | AA | AA | AA |
| | SEM (cycle) | AA | AA | AA | AA | AA | AA | AA |
| | AFM (depth) | AA | AA | AA | AA | AA | AA | AA |

TABLE 2

| | | Difference in Inorganic Material Layer | | | | | | | |
|---|---|---|---|---|---|---|---|---|---|
| | | Ex. 1 | Ex. 9 | Ex. 10 | Ex. 11 | Ex. 12 | Ex. 13 | Ex. 14 | Ex. 15 |
| Substrate | Type | PSF | PSF | PSF | PSF | PSF | PSF | PSF | PSF |
| | Thickness (mm) | 0.12 | 0.12 | 0.12 | 0.12 | 0.12 | 0.12 | 0.12 | 0.12 |
| Resin layer | Type | PMMA | PMMA | PMMA | PMMA | PMMA | PMMA | PMMA | PMMA |
| | Thickness (μm) | 1.2 | 1.2 | 1.2 | 1.2 | 1.2 | 1.2 | 1.2 | 1.2 |
| | Weight average molecular weight (Mw)(×10$^4$) | 8.3 | 8.3 | 8.3 | 8.3 | 8.3 | 8.3 | 8.3 | 8.3 |
| Inorganic material layer | Film material | SiO$_2$ | ZrO$_2$ | ITO | TiO$_2$ | Si | SiO$_x$ | SiO$_2$/ZrO$_2$ | SiO$_2$/ZrO$_2$ |
| | Thickness (nm) | 3.8 | 3.2 | 2.8 | 2.2 | 3.4 | 4.8 | 4.8 | 4.2 |
| | Standard deviation of thickness | 0.75 | 0.98 | 0.40 | 0.40 | 0.80 | 0.49 | 0.57 | 0.57 |

TABLE 2-continued

Difference in Inorganic Material Layer

| | | Ex. 1 | Ex. 9 | Ex. 10 | Ex. 11 | Ex. 12 | Ex. 13 | Ex. 14 | Ex. 15 |
|---|---|---|---|---|---|---|---|---|---|
| Release agent layer | Release agent | HD-1100 | HD-1100 | HD-1100 | HD-1100 | HD-1100 | HD-1100 | HD-1100 | HD-1100 |
| | Thickness (nm) | 3.2 | 3.2 | 2.8 | 2.2 | 3.4 | 2.8 | 3.2 | 2.8 |
| | Standard deviation of thickness | 0.75 | 0.98 | 0.40 | 0.40 | 0.80 | 0.40 | 0.45 | 0.58 |
| | Contact angle with respect to water — Before imprinting (°) | 110 | 110 | 110 | 110 | 110 | 110 | 110 | 110 |
| | After imprinting (°) | 108 | 106 | 106 | 106 | 106 | 106 | 106 | 106 |
| | Change ratio (%) between before and after imprintings | 1.8 | 3.6 | 3.6 | 3.6 | 3.6 | 3.6 | 3.6 | 3.6 |
| Pattern cycle of Master mold used (nm) | | 300 | 300 | 300 | 300 | 300 | 300 | 300 | 300 |
| Form of Master mold used | | L/S | L/S | L/S | L/S | L/S | L/S | L/S | L/S |
| Imprinting result | Macro evaluation | AA | AA | AA | AA | AA | AA | AA | AA |
| | SEM (cycle) | AA | AA | AA | AA | AA | AA | AA | AA |
| | AFM (depth) | AA | AA | AA | AA | AA | AA | AA | AA |

TABLE 3

Type of Release Agent

| | | Ex. 1 | Ex. 16 | Ex. 17 | Ex. 18 | Ex. 19 |
|---|---|---|---|---|---|---|
| Substrate | Type | PSF | PSF | PSF | PSF | PSF |
| | Thickness (mm) | 0.12 | 0.12 | 0.12 | 0.12 | 0.12 |
| Resin layer | Type | PMMA | PMMA | PMMA | PMMA | PMMA |
| | Thickness (μm) | 1.2 | 1.2 | 1.2 | 1.2 | 1.2 |
| | Weight average molecular weight (Mw)(×$10^4$) | 8.3 | 8.3 | 8.3 | 8.3 | 8.3 |
| Inorganic material layer | Film material | $SiO_2$ | $SiO_2$ | $SiO_2$ | $SiO_2$ | $SiO_2$ |
| | Thickness (nm) | 3.8 | 3.2 | 2.6 | 4.6 | 3.2 |
| | Standard deviation of thickness | 0.75 | 0.75 | 0.49 | 0.49 | 0.98 |
| Release agent layer | Release agent | HD-1100 | A | B | C | D |
| | Thickness (nm) | 3.2 | 3.4 | 4.6 | 3.2 | 2.6 |
| | Standard deviation of thickness | 0.75 | 0.80 | 0.49 | 0.75 | 0.49 |
| | Contact angle with respect to water — Before imprinting (°) | 110 | 110 | 110 | 110 | 103 |
| | After imprinting (°) | 108 | 106 | 108 | 108 | 101 |
| | Change ratio (%) between before and after imprintings | 1.8 | 3.6 | 1.8 | 1.8 | 1.9 |
| Pattern cycle of Master mold used (nm) | | 300 | 300 | 300 | 300 | 300 |
| Form of Master mold used | | L/S | L/S | L/S | L/S | L/S |
| Imprinting result | Macro evaluation | AA | AA | AA | AA | AA |
| | SEM (cycle) | AA | AA | AA | AA | AA |
| | AFM (depth) | AA | AA | AA | AA | AA |

Release agent:
A: tridecafluoro(1,1,2,2)tetrahydrooctyltrichlorosilane
B: perfluorohexanoic acid
C: 1H,1H-tridecafluoroheptylamine
D: methyl triisocyanate silane

TABLE 4

Type of Resin

| | | Ex. 1 | Ex. 20 | Ex. 21 | Ex. 22 |
|---|---|---|---|---|---|
| Substrate | Type | PSF | PSF | PSF | PSF |
| | Thickness (mm) | 0.12 | 0.12 | 0.12 | 0.12 |
| Resin layer | Type | PMMA | PSt | Epoxy resin | Acrylic resin |
| | Thickness (μm) | 1.2 | 1.2 | 1.2 | 1.2 |
| | Weight average molecular weight (Mw)(×$10^4$) | 8.3 | 8.8 | —[(1)] | —[(1)] |
| Inorganic material layer | Film material | $SiO_2$ | $SiO_2$ | $SiO_2$ | $SiO_2$ |
| | Thickness (nm) | 3.8 | 2.8 | 2.2 | 3.4 |
| | Standard deviation of thickness | 0.75 | 0.40 | 0.40 | 0.80 |
| Release agent layer | Release agent | HD-1100 | HD-1100 | HD-1100 | HD-1100 |
| | Thickness (nm) | 3.2 | 4.6 | 3.2 | 3.2 |
| | Standard deviation of thickness | 0.75 | 0.49 | 0.98 | 0.75 |
| | Contact angle — Before imprinting (°) | 110 | 110 | 110 | 110 |

TABLE 4-continued

| | | Type of Resin | | | |
| --- | --- | --- | --- | --- | --- |
| | | Ex. 1 | Ex. 20 | Ex. 21 | Ex. 22 |
| with respect to water | After imprinting (°) | 108 | 108 | 108 | 108 |
| | Change ratio (%) between before and after imprintings | 1.8 | 1.8 | 1.8 | 1.8 |
| Pattern cycle of Master mold used (nm) | | 300 | 300 | 300 | 300 |
| Form of Master mold used | | L/S | L/S | L/S | L/S |
| Imprinting result | Macro evaluation | AA | AA | AA | AA |
| | SEM (cycle) | AA | AA | AA | AA |
| | AFM (depth) | AA | AA | AA | AA |

[1]immeasurable because of cross-linked resin

TABLE 5

| | | Three-layer Structure | | | |
| --- | --- | --- | --- | --- | --- |
| | | Ex. 2 | Ex. 23 | Ex. 24 | Ex. 25 |
| Resin layer | Type | PMMA | COP | PC | PET |
| | Thickness (mm) | 3.0 | 2.0 | 1.0 | 0.1 |
| | Weight average molecular weight (Mw)(×10$^4$) | —[2] | —[2] | —[2] | —[2] |
| Inorganic material layer | Film material | SiO$_2$ | SiO$_2$ | SiO$_2$ | SiO$_2$ |
| | Thickness (nm) | 3.8 | 2.8 | 2.2 | 3.4 |
| | Standard deviation of thickness | 0.75 | 0.40 | 0.40 | 0.80 |
| Release agent layer | Release agent | HD-1100 | HD-1100 | HD-1100 | HD-1100 |
| | Thickness (nm) | 3.2 | 2.6 | 4.6 | 2.4 |
| | Standard deviation of thickness | 0.75 | 0.49 | 0.49 | 0.49 |
| | Contact angle Before imprinting (°) | 110 | 110 | 110 | 110 |
| | with respect to After imprinting (°) | 108 | 108 | 108 | 108 |
| | water Change ratio (%) between before and after imprintings | 1.8 | 1.8 | 1.8 | 1.8 |
| Pattern cycle of Master mold used (nm) | | 300 | 300 | 300 | 300 |
| Form of Master mold used | | L/S | L/S | L/S | L/S |
| Imprinting result | Macro evaluation | AA | AA | AA | AA |
| | SEM (cycle) | AA | AA | AA | AA |
| | AFM (depth) | AA | AA | AA | AA |

[2]Unknown because of commercial films or plates

TABLE 6

| | | Type of Substrate | | | | | | |
| --- | --- | --- | --- | --- | --- | --- | --- | --- |
| | | Ex. 1 | Ex. 26 | Ex. 27 | Ex. 28 | Ex. 29 | Ex. 30 | Ex. 31 |
| Substrate | Type | PSF | glass | Si wafer | sapphire | GaN | PET | PC |
| | Thickness (mm) | 0.12 | 1.1 | 0.5 | 0.5 | 0.4 | 0.1 | 0.12 |
| Resin layer | Type | PMMA | PMMA | PMMA | PMMA | PMMA | PMMA | PMMA |
| | Thickness (μm) | 1.2 | 1.2 | 1.2 | 1.2 | 1.2 | 1.2 | 1.2 |
| | Weight average molecular weight (Mw)(×10$^4$) | 8.3 | 8.3 | 8.3 | 8.3 | 8.3 | 8.3 | 8.3 |
| Inorganic material layer | Film material | SiO$_2$ | SiO$_2$ | SiO$_2$ | SiO$_2$ | SiO$_2$ | SiO$_2$ | SiO$_2$ |
| | Thickness (nm) | 3.8 | 4.8 | 3.2 | 2.8 | 4.6 | 3.8 | 3.4 |
| | Standard deviation of thickness | 0.75 | 0.49 | 0.75 | 0.49 | 0.49 | 0.75 | 0.48 |
| Release agent layer | Release agent | HD-1100 | HD-1100 | HD-1100 | HD-1100 | HD-1100 | HD-1100 | HD-1100 |
| | Thickness (nm) | 3.2 | 3.4 | 3.6 | 4.8 | 3.2 | 2.6 | 4.6 |
| | Standard deviation of thickness | 0.75 | 0.49 | 0.49 | 0.40 | 0.75 | 0.49 | 0.49 |
| | Contact angle Before imprinting (°) | 110 | 110 | 110 | 110 | 110 | 110 | 110 |
| | with respect to After imprinting (°) | 108 | 108 | 108 | 108 | 108 | 108 | 108 |
| | water Change ratio (%) between before and after imprintings | 1.8 | 1.8 | 1.8 | 1.8 | 1.8 | 1.8 | 1.8 |
| Pattern cycle of Master mold used (nm) | | 300 | 300 | 300 | 300 | 300 | 300 | 300 |
| Form of Master mold used | | L/S | L/S | L/S | L/S | L/S | L/S | L/S |
| Imprinting result | Macro evaluation | AA | AA | AA | AA | AA | AA | AA |
| | SEM (cycle) | AA | AA | AA | AA | AA | AA | AA |
| | AFM (depth) | AA | AA | AA | AA | AA | AA | AA |

TABLE 6-continued

| | | \multicolumn{7}{c}{Type of Substrate} | | | | | | |
|---|---|---|---|---|---|---|---|---|
| | | Ex. 32 | Ex. 33 | Ex. 34 | Ex. 35 | Ex. 36 | Ex. 37 | Ex. 38 |
| Substrate | Type | PEN | polyimide | PMMA | GC | SiC | PMMA | PET |
| | Thickness (mm) | 0.12 | 0.3 | 0.12 | 1.0 | 0.43 | 0.12 | 0.25 |
| Resin layer | Type | PMMA | PMMA | PMMA | PMMA | PMMA | PMMA | PMMA |
| | Thickness (μm) | 1.2 | 1.2 | 1.2 | 1.2 | 1.2 | 1.2 | 1.2 |
| | Weight average molecular weight (Mw)(×$10^4$) | 8.3 | 8.3 | 8.3 | 8.3 | 8.3 | 8.3 | 8.3 |
| Inorganic material layer | Film material | $SiO_2$ | $SiO_2$ | $SiO_2$ | $SiO_2$ | $SiO_2$ | $SiO_2$ | $SiO_2$ |
| | Thickness (nm) | 3.8 | 2.8 | 4.6 | 3.4 | 3.5 | 4.8 | 2.6 |
| | Standard deviation of thickness | 0.75 | 0.48 | 0.48 | 0.49 | 0.49 | 0.40 | 0.49 |
| Release agent layer | Release agent | HD-1100 | HD-1100 | HD-1100 | HD-1100 | HD-1100 | HD-1100 | HD-1100 |
| | Thickness (nm) | 3.2 | 2.8 | 3.2 | 2.5 | 4.5 | 2.4 | 3.4 |
| | Standard deviation of thickness | 0.96 | 0.40 | 0.96 | 0.48 | 0.49 | 0.49 | 0.49 |
| Contact angle with respect to water | Before imprinting (°) | 110 | 110 | 110 | 110 | 110 | 110 | 110 |
| | After imprinting (°) | 108 | 108 | 108 | 108 | 108 | 108 | 108 |
| | Change ratio (%) between before and after imprintings | 1.8 | 1.8 | 1.8 | 1.8 | 1.8 | 1.8 | 1.8 |
| Pattern cycle of Master mold used (nm) | | 300 | 300 | 300 | 300 | 300 | 300 | 300 |
| Form of Master mold used | | L/S | L/S | L/S | L/S | L/S | L/S | L/S |
| Imprinting result | Macro evaluation | AA | AA | AA | AA | AA | AA | AA |
| | SEM (cycle) | AA | AA | AA | AA | AA | AA | AA |
| | AFM (depth) | AA | AA | AA | AA | AA | AA | AA |

TABLE 7

| | | \multicolumn{3}{c}{Imprinting Method} | | |
|---|---|---|---|---|
| | | Ex. 1 | Ex. 39 | Ex. 40 |
| Substrate | Type | PSF | PSF | PSF |
| | Thickness (mm) | 0.12 | 0.12 | 0.12 |
| Resin layer | Type | PMMA | CHMA | PMMA |
| | Thickness (μm) | 1.2 | 1.2 | 1.2 |
| | Weight average molecular weight (Mw)(×$10^4$) | 8.3 | 8.3 | 8.3 |
| Inorganic material layer | Film material | $SiO_2$ | $SiO_2$ | $SiO_2$ |
| | Thickness (nm) | 3.8 | 4.6 | 2.4 |
| | Standard deviation of thickness | 0.75 | 0.49 | 0.49 |
| Release agent layer | Release agent | HD-1100 | HD-1100 | HD-1100 |
| | Thickness (nm) | 3.2 | 3.4 | 3.2 |
| | Standard deviation of thickness | 0.75 | 0.49 | 0.75 |
| Contact angle with respect to water | Before imprinting (°) | 110 | 110 | 110 |
| | After imprinting (°) | 108 | 108 | 108 |
| | Change ratio (%) between before and after imprintings | 1.8 | 1.8 | 1.8 |
| Pattern cycle of Master mold used (nm) | | 300 | 300 | 300 |
| Form of Master mold used | | L/S | L/S | L/S |
| Imprinting method | | UV/batch (sheet) | heat/batch (sheet) | UV/continuous (roll) |
| Imprinting result | Macro evaluation | AA | AA | AA |
| | SEM (cycle) | AA | AA | AA |
| | AFM (depth) | AA | AA | AA |

TABLE 8

| | | Com. Ex. 1 | Com. Ex. 2 | Com. Ex. 3 | Com. Ex. 4 | Com. Ex. 5 |
|---|---|---|---|---|---|---|
| Substrate | Type | PSF | PSF | PSF | PSF | PSF |
| | Thickness (mm) | 0.12 | 0.12 | 0.12 | 0.12 | 0.12 |
| Resin layer | Type | PMMA | PMMA | PMMA | Fluorine-base | Fluorine-base |
| | Thickness (μm) | 1.2 | 1.2 | 1.2 | 1.2 | 1.2 |
| | Weight average molecular weight (Mw) (×$10^4$) | 8.3 | 8.3 | 8.3 | 8.3 | 8.3 |
| Inorganic material layer | Film material | — | — | $SiO_2$ | — | — |
| | Thickness (nm) | — | — | 4.8 | — | — |
| | Standard deviation of thickness | — | — | 0.40 | — | — |

TABLE 8-continued

|  |  | Com. Ex. 1 | Com. Ex. 2 | Com. Ex. 3 | Com. Ex. 4 | Com. Ex. 5 |
|---|---|---|---|---|---|---|
| Release agent layer | Release agent | — | HD-1100 | — | — | HD-1100 |
|  | Thickness (nm) | — | 4.6 | — | — | 3.6 |
|  | Standard deviation of thickness | — | 0.49 | — | — | 0.49 |
| Contact angle with respect to water | Before imprinting (°) | 90 | 93 | 30 | 96 | 98 |
|  | After imprinting (°) | 62 | 66 | 22 | 65 | 68 |
|  | Change ratio (%) between before and after imprintings | 31.1 | 29.0 | 26.7 | 32.3 | 30.6 |
| Pattern cycle of Master mold used (nm) |  | 300 | 300 | 300 | 300 | 300 |
| Form of Master mold used |  | L/S | L/S | L/S | L/S | L/S |
| Imprinting result | Macro evaluation | BB | BB | BB | BB | BB |
|  | SEM (cycle) | BB | BB | BB | BB | BB |
|  | AFM (depth) | BB | BB | BB | BB | BB |

TABLE 9

|  |  | Ref. Ex. 1 | Ref. Ex. 2 | Ref. Ex. 3 | Ref. Ex. 4 |
|---|---|---|---|---|---|
| Substrate | Type | PSF | PSF | PSF | PSF |
|  | Thickness (mm) | 0.12 | 0.12 | 0.12 | 0.12 |
| Resin layer | Type | PMMA | PMMA | PMMA | PMMA |
|  | Thickness (μm) | 1.2 | 1.2 | 1.2 | 1.2 |
|  | Weight average molecular weight (Mw) (×10$^4$) | 8.3 | 8.3 | 8.3 | 8.3 |
| Inorganic material layer | Film material | SiO$_2$ | SiO$_2$ | SiO$_2$ | SiO$_2$ |
|  | Thickness (nm) | 120 | less than 0.5 | 4.6 | 2.4 |
|  | Standard deviation of thickness | 0.49 | 0.04 | 0.49 | 0.49 |
| Release agent layer | Release agent | HD-1100 | HD-1100 | HD-1100 | HD-1100 |
|  | Thickness (nm) | 4.6 | 3.2 | 21.4 | less than 0.5 |
|  | Standard deviation of thickness | 0.49 | 0.75 | 0.49 | 0.07 |
| Contact angle with respect to water | Before imprinting (°) | 90 | 92 | 110 | 80 |
|  | After imprinting (°) | 75 | 70 | 108 | 65 |
|  | Change ratio (%) between before and after imprintings | 16.7 | 23.9 | 1.8 | 25 |
| Pattern cycle of Master mold used (nm) |  | 300 | 300 | 300 | 300 |
| Form of Master mold used |  | L/S | L/S | L/S | L/S |
| Imprinting result | Macro evaluation | BB | BB | AA | BB |
|  | SEM (cycle) | BB | AA | BB | BB |
|  | AFM (depth) | BB | AA | BB | BB |

Example 41

(i) Preparation of a Resin for a Resin Mold (PMMA)

Into a flask equipped with a stirring device, a nitrogen-introducing tube, a thermometer and a reflux cooling tube, 100 parts by weight of methyl methacrylate (product name, manufactured by Kyoeisha Chemical Co., Ltd.) and 100 parts by weight of toluene were added. Then, while introducing 0.3 L/min of a nitrogen gas into the flask, the content in the flask was heated to 80° C., and 0.5 part by weight of dimethyl 2,2-azobis(2-methylpropionate) (trade name: V-601, manufactured by Wako Pure Chemical Industries, Ltd.) was added as an initiator. The mixture was kept for 8.0 hours at 80° C.

Then, the supply of the nitrogen gas was terminated, and 100 parts by weight of toluene was added thereby lowering the temperature of the reaction liquid to terminate the reaction. A resin for a resin mold was thus produced.

A weight average molecular weight of the resin obtained was measured by gas chromatography, and found to be 83,000.

(ii) Production of a Resin Mold (ii)-a

The resin for a resin mold produced in (i) was diluted ten times (volume) with toluene, and was spin coated on a PET film (product name: Lumirror™, manufactured by Toray Industries, Inc., thickness: 0.125 mm) substrate. The coated resin was dried using a hot plate at 130° C. for 15 minutes, thereby forming a resin layer having a thickness of 1.2 μm (the thickness was 8 times the height of a form of a master mold to be used). The resin thickness was an average of thicknesses measured at arbitral five points of the surface using a film thickness measurement instrument (model: F20, manufactured by Filmmetrics, Inc.). Then, to see the adhesion between the resin and the substrate (PET film), after the coating of the resin, an adhesive tape (product name: CELLOTAPE™ No. 405, manufactured by Nichiban Co., Ltd.) was attached on the surface of the resin, and immediately thereafter, was peeled by hand, to see at the portion whether there was a peeling of the resin (a test to see adhesion with the substrate).

(ii)-b Heat Nanoprinting of an Adhesive Layer

The laminate consisting of the film substrate and the resin layer was heated to 140° C. On the surface of the resin layer, a master mold (a quartz mold which had been subjected to release treatment, a transfer surface of 576 mm$^2$, 150 mmL/S, a cycle of 300 mm, a depth of 150 mm) was pressed, thereby carrying out heat transferring at 140° C. Then, the laminate was cooled to not higher than 80° C., and the master mold was detached. A resin mold (a transfer surface of 576 mm$^2$, 150 L/S, a cycle of 300 nm, a depth of 150 nm) was thus obtained.

The cycle and line width were evaluated with SEM (S-4800 manufactured by Hitachi High Technologies), and the depth (height) was evaluated with AFM (L-trace manufactured by SII Nano Technology Inc.).

(iii) Coating of the Resin Mold with an Oxide Film

On the surface of the resin mold produced in (ii), an oxide film ($SiO_2$) was deposited in order for the film to have a thickness of 5 nm, thereby obtaining a resin mold coated with the oxide film. The deposition was vacuum deposition using an optical thin film coater (OPTORUN OMC-1100) and was carried out at room temperature for about 1 minute. The vacuum deposition was carried out with rotation and revolution with respect to a target, and at 30 seconds from the initiation of the deposition, the direction of the revolution was reversed.

After the deposition, the form surface was visually observed to have neither cracks nor defect. The thickness of the oxide film was determined by cutting the film with a microtome (Leicac ENUC 6 manufactured by Leica Microsystems) and observing a cross section thereof with SEM.

(iv) Release Treatment of the Resin Mold Coated with the Oxide Film

The resin mold coated with the oxide film obtained in (iii) was soaked for 1 hour in a release agent liquid (product name: OPTOOL HD-1100, manufactured by Daikin Industries, Ltd.), and took out from the liquid, and was allowed to stand still for 1 hour in humid heated environment of 70° C. and 90%. The resultant mold was rinsed using a fluorine-based solvent (product name: OPTOOL HD-TH, manufactured by Daikin Industries, Ltd.), and was allowed to stand still for 24 hours in environment of 23° C. and 65%. Then, the mold was subjected to measurement of a contact angle with respect to pure water. The contact angle was found to be 110°. The form had neither defect nor change (line width: 150 nm, cycle: 300 nm, depth: 150 nm). The thickness of the release layer was determined by cutting the film with a microtome (Leicac ENUC 6 manufactured by Leica Microsystems) and observing a cross section thereof with SEM.

(v) Photo-Nano-Printing Using the Resin Mold

On the resin mold for imprinting obtained in (iv), 0.2 mL of a photo-curable resin (product name: PAK-02, manufactured by Toyo Gosei Co., Ltd.) was dropped, and thereon, a polycarbonate film (product name: LEXAN, manufactured by Asahi Glass Co., Ltd.) was placed. Then, pressing was carried out at 0.4 MPa for 1 hour using a photo-nano-printing device (manufactured by Engineerng System Co., Ltd.). Then, ultraviolet ray was applied (10 $mW/cm^2$) for 2 minutes. Then, the resin mold was detached. Then, with respect to the resin subjected to transferring, the resin transfer onto the mold was observed with an optical microscope, and the presence of a form change in the resin subjected to transferring was observed with SEM and AFM (line width: 148 nm, cycle: 298 nm, depth: 148 nm).

Using the resin mold obtained, continuous photo-nanoimprinting of 20 shots was carried out. The imprinting was achieved without any problem.

Example 42

A resin for a resin mold was produced in the same manner as in the step (i) of Example 41, except that in the step (i) of Example 41, 100 parts by weight of methyl methacrylate was replaced by 80 parts by weight of methyl methacrylate and 20 parts by weight of glycidyl methacrylate (product name: LIGHT ESTER G, manufactured by Kyoeisha Chemical Co., Ltd.). Except for using the resin for a resin mold thus obtained, the same operation was carried out as in the steps (ii) to (v).

The result is shown in Table 10.

TABLE 10

| | | Treatment Method of Inorganic Material Layer | | | | |
|---|---|---|---|---|---|---|
| | | | | Ex. 41 | Ex. 42 | Ex. 45 |
| Mold | | Master mold | | I | I | I |
| | Substrate | Type | | PET | PET | PET |
| | | Thickness (mm) | | 0.125 | 0.125 | 0.125 |
| | Resin layer | Composition | Methyl methacrylate | 100 | 80 | 80 |
| | | | Glycidyl methacrylate | | 20 | 20 |
| | | Thickness | Actual Film Thickness (μm) | 1.2 | 1.2 | 1.2 |
| | | | Form height × n (times) | 8 | 8 | 8 |
| | | Weight average molecular weight (Mw) (×$10^4$) | | 8.3 | 8.3 | 8.3 |
| | | Adhesion with substrate | | AA | AA | AA |
| | Inorganic material layer | Film material | | $SiO_2$ | $SiO_2$ | $SiO_2$ |
| | | Treatment method | | A | A | B |
| | | Thickness (nm) | a | 4 | 4 | 4 |
| | | | b | 4 | 4 | 4 |
| | | | c | 4 | 4 | 3 |
| | | | d | 3 | 3 | 6 |
| | | Standard deviation | | 0.43 | 0.43 | 1.09 |
| | Release layer | Release agent | | HD-1100 | HD-1100 | HD-1100 |
| | | Thickness (nm) | e | 3 | 3 | 3 |
| | | | f | 3 | 3 | 3 |
| | | | g | 3 | 3 | 3 |
| | | | h | 2 | 2 | 2 |
| | | Standard deviation | | 0.43 | 0.43 | 0.43 |
| | Contact angle with respect to water | Before imprinting | | 110 | 110 | 110 |
| | | After imprinting | | 108 | 108 | 110 |
| | | Change ratio (%) between before and after imprintings | | 1.8 | 1.8 | 0.0 |

TABLE 10-continued

| | | Treatment Method of Inorganic Material Layer | | | |
|---|---|---|---|---|---|
| | Imprinting result | Macro inspection | AA | AA | AA |
| | | SEM (cycle) | AA | AA | AA |
| | | AFM (depth) | AA | AA | AA |
| | | Possible number of shots | AA | AAA | AA |

| | | | | Ref. Ex. 5 | Ref. Ex. 6 |
|---|---|---|---|---|---|
| Mold | | Master mold | | I | I |
| | Substrate | Type | | PET | PET |
| | | Thickness (mm) | | 0.125 | 0.125 |
| | Resin layer | Composition | Methyl methacrylate | 80 | 80 |
| | | | Glycidyl methacrylate | 20 | 20 |
| | | Thickness | Actual Film Thickness (μm) | 1.2 | 1.2 |
| | | | Form height × n (times) | 8 | 8 |
| | | Weight average molecular weight (Mw) (×10$^4$) | | 8.3 | 8.3 |
| | | Adhesion with substrate | | AA | AA |
| | Inorganic material layer | Film material | | SiO$_2$ | SiO$_2$ |
| | | Treatment method | | C | D |
| | | Thickness (nm) | a | 3 | 4 |
| | | | b | 4 | 5 |
| | | | c | 2 | 3 |
| | | | d | 9 | 11 |
| | | Standard deviation | | 8.92 | 12.4 |
| | Release layer | Release agent | | HD-1100 | HD-1100 |
| | | Thickness (nm) | e | 3 | 3 |
| | | | f | 3 | 3 |
| | | | g | 3 | 3 |
| | | | h | 2 | 2 |
| | | Standard deviation | | 0.43 | 0.43 |
| | Contact angle with respect to water | Before imprinting | | 110 | 105 |
| | | After imprinting | | 90 | 85 |
| | | Change ratio (%) between before and after imprintings | | 18.2 | 19.0 |
| | Imprinting result | Macro inspection | | AA | BB |
| | | SEM (cycle) | | BB | BB |
| | | AFM (depth) | | BB | BB |
| | | Possible number of shots | | — | — |

A: rotation + revolution (with direction reverse)
B: rotation + revolution (without direction reverse)
C: only rotation
D: only revolution
Master mold: I: pattern cycle: 300 nm, height: 150 nm, form: L/S
Imprinting result:
Macro inspection: AA: transfer-adhering was less than 1% of overall area, BB: transfer-adhering was 1% or more of overall area
SEM/AFM inspection: AA: change ratio after imprinting was less than 5% BB: change ratio after imprinting was 5% or more
Possible number of shots: AA: 20 shots was possible AAA: 50 shots was possible

Example 43

A resin for a resin mold was prepared in the same manner as in (i) of Example 41, except that in the step (i) of Example 41, 100 parts by weight of methyl methacrylate was replaced by 99 parts by weight of methyl methacrylate and 1.0 part by weight of 4-hydroxybutylacrylate glycidyl ether (product name: 4HBAGE, manufactured by Nihon Kasei Co., Ltd.).

The resin for a resin mold thus obtained was subjected to the steps (ii) to (v) in the same manner.

The result is shown in Table 11.

Using the resin mold obtained, continuous photo-nanoimprinting of 20 shots was carried out. The imprinting was achieved without any problem.

Example 44

A resin for a resin was prepared in the same manner as in the step (i) of Example 41, except that in the step (i) of Example 41, 100 parts by weight of methyl methacrylate was replaced by 51 parts by weight of methyl methacrylate and 49.0 parts by weight of 1,2-epoxy-vinylcyclohexane (product name: CEL2000, manufactured by Dicel Chemical Industies, Ltd.).

Using the resin obtained, a resin was formed in the same manner as in Example 41, and using this resin mold, continuous photo-nanoimprinting of 20 shots was carried out. The imprinting was achieved without any problem.

TABLE 11

| | | Composition of Resin Layer | | | |
|---|---|---|---|---|---|
| | | | Ex. 41 | Ex. 42 | Ex. 43 |
| | | Master mold | | I | |
| Mold | Substrate | Type | | PET | |
| | | Thickness (mm) | | 0.125 | |

TABLE 11-continued

| Composition of Resin Layer | | | | | | |
|---|---|---|---|---|---|---|
| Resin layer | Composition | Methyl methacrylate | 100 | 80 | 99 | |
| | | Styrene | | | | |
| | | Isobonyl methacrylate | | | | |
| | | Glycidyl methacrylate | | 20 | | |
| | | 4-hydroxybutyl acrylate glycidyl ether | | | 1 | |
| | | 1,2-epoxy-vinylcyclohexane | | | | |
| | Thickness | Actual Film Thickness (μm) | 1.2 | 1.2 | 1.2 | |
| | | Form height × n (times) | 8 | 8 | 8 | |
| | Weight average molecular weight (Mw) (×10⁴) | | 8.3 | 8.3 | 8.8 | |
| | Adhesion with substrate | | AA | AA | AA | |
| Inorganic material layer | Film material | | | SiO₂ | | |
| | Treatment method | | | A | | |
| | Thickness (nm) | A | 4 | 4 | 4 | |
| | | B | 4 | 4 | 4 | |
| | | C | 4 | 4 | 4 | |
| | | D | 5 | 5 | 5 | |
| | Standard deviation | | 0.43 | 0.43 | 0.43 | |
| Release layer | Release agent | | | HD-1100 | | |
| | Thickness (nm) | E | 3 | 3 | 3 | |
| | | F | 3 | 3 | 3 | |
| | | G | 3 | 3 | 3 | |
| | | H | 2 | 2 | 2 | |
| | Standard deviation | | 0.43 | 0.43 | 0.43 | |
| Contact angle with respect to water | Before imprinting | | 110 | 110 | 110 | |
| | After imprinting | | 108 | 108 | 110 | |
| | Change ratio (%) between before and after imprintings | | 1.8 | 1.8 | 0.0 | |
| Imprinting result | Macro inspection | | AA | AA | AA | |
| | SEM (cycle) | | AA | AA | AA | |
| | AFM (depth) | | AA | AA | AA | |

| | | | Ex. 44 | Ex. 63 | Ex. 64 |
|---|---|---|---|---|---|
| Mold Substrate | Master mold | | | I | |
| | Type | | | PET | |
| | Thickness (mm) | | | 0.125 | |
| Resin layer | Composition | Methyl methacrylate | 51 | | |
| | | Styrene | | 80 | |
| | | Isobonyl methacrylate | | | 80 |
| | | Glycidyl methacrylate | | 20 | 20 |
| | | 4-hydroxybutyl acrylate glycidyl ether | | | |
| | | 1,2-epoxy-vinylcyclohexane | 49 | | |
| | Thickness | Actual Film Thickness (μm) | 1.2 | 1.2 | 1.2 |
| | | Form height × n (times) | 8 | 8 | 8 |
| | Weight average molecular weight (Mw) (×10⁴) | | 9.2 | 9.5 | 8.5 |
| | Adhesion with substrate | | AA | AA | AA |
| Inorganic material layer | Film material | | | SiO₂ | |
| | Treatment method | | | A | |
| | Thickness (nm) | A | 4 | 4 | 4 |
| | | B | 4 | 4 | 4 |
| | | C | 4 | 4 | 4 |
| | | D | 5 | 5 | 5 |
| | Standard deviation | | 0.43 | 0.43 | 0.43 |
| Release layer | Release agent | | | HD-1100 | |
| | Thickness (nm) | E | 3 | 3 | 3 |
| | | F | 3 | 3 | 3 |
| | | G | 3 | 3 | 3 |
| | | H | 2 | 2 | 2 |
| | Standard deviation | | 0.43 | 0.43 | 0.43 |
| Contact angle with respect to water | Before imprinting | | 110 | 110 | 110 |
| | After imprinting | | 110 | 108 | 108 |
| | Change ratio (%) between before and after imprintings | | 0.0 | 1.8 | 1.8 |
| Imprinting result | Macro inspection | | AA | AA | AA |
| | SEM (cycle) | | AA | AA | AA |
| | AFM (depth) | | AA | AA | AA |

Inorganic material treatment method: as in Note of Table 10
Master mold: I: pattern cycle: 300 nm, height: 150 nm, form: L/S
*1: Resin was not able to be produced.
*2: Immeasurable

Example 45

A resin mold was prepared in the same manner as in Example 41, except that in Example 41, in the deposition of a metal, with the adherend subjected to rotation and revolution without direction reverse, vacuum deposition was carried out for 60 seconds. The inorganic material layer formed had a form change, but when using the resin mold obtained to carry out continuous photo-nanoimprinting of 20 shots, the imprinting was achieved without any problem. The result is shown in Table 10.

Example 46

The same operation was carried out as in the steps (i) to (v) of Example 42, except that in the step (ii) of Example 42, the thickness of the resin was changed to 0.4 μm, and the master mold to be used was changed to a quartz mold which had been subjected to release treatment (a transfer surface of 576 mm$^2$, 25 nmL/S, a cycle of 50 nm, a depth of 50 nm).

The result is shown in Table 12.

Using the resin mold obtained, continuous photo-nanoimprinting of 20 shots was carried out. The imprinting was achieved without any problem.

Example 47

The same operation was carried out as in the steps (i) to (v) of Example 42, except that in the step (ii) of Example 42, the master mold to be used was changed to a quartz mold which had been subjected to release treatment (a transfer surface of 576 mm$^2$, 75 nmL/S, a cycle of 150 nm, a depth of 150 nm).

The result is shown in Table 12.

Using the resin mold obtained, continuous photo-nanoimprinting of 20 shots was carried out. The imprinting was achieved without any problem.

Example 48

The same operation was carried out as in the steps (i) to (v) of Example 42, except that in the step (ii) of Example 42, the thickness of the resin was changed to 2.4 μm, and the master mold to be used was changed to a quartz mold which had been subjected to release treatment (a transfer surface of 576 mm$^2$, 10,000 nmL/S, a cycle of 20,000 nm, a depth of 300 nm).

The result is shown in Table 12.

Using the resin mold obtained, continuous photo-nanoimprinting of 20 shots was carried out. The imprinting was achieved without any problem.

Example 49

The same operation was carried out as in the steps (i) to (v) of Example 42, except that in the step (ii) of Example 42, the thickness of the resin was changed to 1.6 μm, and the master mold to be used was changed to a quartz mold (a column mold) which had been subjected to release treatment (a transfer surface of 576 mm$^2$, a hole diameter of 200 nm, a cycle of 400 nm, a depth of 200 nm).

The result is shown in Table 12.

Using the resin mold obtained, continuous photo-nanoimprinting of 20 shots was carried out. The imprinting was achieved without any problem.

Example 50

The same operation was carried out as in the steps (i) to (v) of Example 42, except that in the step (ii) of Example 42, the thickness of the resin was changed to 2.4 μm, and the master mold to be used was changed to a quartz mold (a moth eye mold of 300 nm) which had been subjected to release treatment (a transfer surface of 576 mm$^2$, a cycle of 300 nm, a depth of 300 nm).

The result is shown in Table 12.

Using the resin mold obtained, continuous photo-nanoimprinting of 20 shots was carried out. The imprinting was achieved without any problem.

Example 51

The same operation was carried out as in the steps (i) to (v) of Example 42, except that in the step (ii) of Example 42, the thickness of the resin was changed to 6.4 μm, and the master mold to be used was changed to a quartz mold (a microlens mold) which had been subjected to release treatment (a transfer surface of 576 mm$^2$, a hole diameter of 10,000 nm, a cycle of 20,000 nm, a depth of 800 nm).

The result is shown in Table 12.

Using the resin mold obtained, continuous photo-nanoimprinting of 20 shots was carried out. The imprinting was achieved without any problem.

TABLE 12

| | | Form of Master Mold | | Ex. 42 | Ex. 46 | Ex. 47 |
|---|---|---|---|---|---|---|
| Master mold | | Type of mold | | I | II | III |
| | | Cycle (nm) | | 300 | 50 | 150 |
| | | Form | | L/S | L/S | L/S |
| Mold | Substrate | Type | | | PET | |
| | | Thickness (mm) | | | 0.12 | |
| | Resin layer | Composition | Methyl methacrylate | | 80 | |
| | | | Glycidyl methacrylate | | 20 | |
| | | Weight average molecular weight (Mw) (×10$^4$) | | | 8.3 | |
| | | Thickness | Actual Film Thickness (μm) | 1.2 | 0.4 | 1.2 |
| | | | Form height × n (times) | 8 | 8 | 8 |
| | | Adhesion with substrate | | | AA | |
| | Inorganic material layer | Film material | | | SiO$_2$ | |
| | | Treatment method | | | A | |
| | | Thickness (nm) | A | 4 | 4 | 4 |
| | | | B | 4 | 4 | 4 |
| | | | C | 4 | 4 | 4 |
| | | | D | 5 | 5 | 5 |

TABLE 12-continued

| Form of Master Mold | | | | | | |
|---|---|---|---|---|---|---|
| Release | | Standard deviation | | 0.43 | 0.43 | 0.43 |
| layer | | Release agent | | | HD-1100 | |
| | Thickness | E | | 3 | 3 | 3 |
| | (nm) | F | | 3 | 3 | 3 |
| | | G | | 3 | 3 | 3 |
| | | H | | 2 | 2 | 2 |
| | | Standard deviation | | 0.43 | 0.43 | 0.43 |
| Contact angle with respect to water | | Before imprinting | | 110 | 110 | 110 |
| | | After imprinting | | 108 | 106 | 106 |
| | | Change ratio (%) between before and after imprintings | | 1.8 | 3.6 | 3.6 |
| Imprinting result | | Macro inspection | | AA | AA | AA |
| | | SEM (cycle) | | AA | AA | AA |
| | | AFM (depth) | | AA | AA | AA |

| | | | Ex. 48 | Ex. 49 | Ex. 50 | Ex. 51 |
|---|---|---|---|---|---|---|
| Master mold | | Type of mold | IV | V | VI | VII |
| | | Cycle (nm) | 20,000 | 400 | 300 | 20,000 |
| | | Form | L/S | column | Moth eye | lens |
| Mold | Substrate | Type | | PET | | |
| | | Thickness (mm) | | 0.12 | | |
| | Resin | Composition | Methyl methacrylate | | 80 | | |
| | layer | | Glycidyl methacrylate | | 20 | | |
| | | Weight average molecular weight (Mw) (×10$^4$) | | 8.3 | | |
| | | Thickness | Actual Film Thickness (μm) | 2.4 | 1.6 | 2.4 | 6.4 |
| | | | Form height × n (times) | 8 | 8 | 8 | 8 |
| | | Adhesion with substrate | | AA | | |
| | Inorganic | Film material | | SiO$_2$ | | |
| | material | Treatment method | | A | | |
| | layer | Thickness | a | 4 | 5 | 5 | 6 |
| | | (nm) | b | 4 | 5 | 7 | 6 |
| | | | c | 4 | 6 | 7 | 4 |
| | | | d | 5 | 5 | 5 | 5 |
| | | Standard deviation | | 0.43 | 0.52 | 0.72 | 0.65 |
| | Release | Release agent | | | HD-1100 | |
| | layer | Thickness | e | 3 | 3 | 3 | 3 |
| | | (nm) | f | 3 | 3 | 3 | 3 |
| | | | g | 3 | 3 | 3 | 3 |
| | | | h | 2 | 2 | 2 | 2 |
| | | Standard deviation | | 0.43 | 0.43 | 0.43 | 0.43 |
| | Contact angle with respect to water | Before imprinting | 110 | 110 | 110 | 110 |
| | | After imprinting | 106 | 106 | 106 | 106 |
| | | Change ratio (%) between before and after imprintings | 3.6 | 3.6 | 3.6 | 3.6 |
| | Imprinting result | Macro inspection | AA | AA | AA | AA |
| | | SEM (cycle) | AA | AA | AA | AA |
| | | AFM (depth) | AA | AA | AA | AA |

Inorganic material treatment method: as in Note of Table 10

Example 52

The same operation was carried out as in the steps (i) to (v) of Example 42, except that in the step (iii) of Example 42, with rotation and revolution, the oxide film was changed to $ZrO_2$.

The result is shown in Table 13.

Using the resin mold obtained, continuous photo-nanoimprinting of 20 shots was carried out. The imprinting was achieved without any problem.

Example 53

The same operation was carried out as in the steps (i) to (v) of Example 42, except that in the step (iii) of Example 42, with rotation and revolution, the oxide film was changed to ITO.

The result is shown in Table 13.

Using the resin mold obtained, continuous photo-nanoimprinting of 20 shots was carried out. The imprinting was achieved without any problem.

Example 54

The same operation was carried out as in the steps (i) to (v) of Example 42, except that in the step (iii) of Example 42, with rotation and revolution, the oxide film was changed to $TiO_2$.

The result is shown in Table 13.

Using the resin mold obtained, continuous photo-nanoimprinting of 20 shots was carried out. The imprinting was achieved without any problem.

Example 55

The same operation was carried out as in the steps (i) to (v) of Example 42, except that in the step (iii) of Example 42, with rotation and revolution, the oxide film was changed to an amorphous-silicon ($\alpha$-Si).

The result is shown in Table 13.

Using the resin mold obtained, continuous photo-nanoimprinting of 20 shots was carried out. The imprinting was achieved without any problem.

Example 56

The same operation was carried out as in the steps (i) to (v) of Example 42, except that in the step (iii) of Example 42, with rotation and revolution, the oxide film was changed to $SiO_x$, a mixture wherein x is 1 to 5.

The result is shown in Table 13.

Using the resin mold obtained, continuous photo-nanoimprinting of 20 shots was carried out. The imprinting was achieved without any problem.

Example 57

The same operation was carried out as in the steps (i) to (v) of Example 42, except that in the step (iii) of Example 42, with rotation and revolution, $SiO_2$ and $ZrO_2$ were deposited simultaneously on the surface of the resin layer to form a coating film of a mixture of the two, thereby changing the oxide film from $SiO_2$ to $SiO_x.ZrO_x$.

The result is shown in Table 13.

Using the resin mold obtained, continuous photo-nanoimprinting of 20 shots was carried out. The imprinting was achieved without any problem.

Example 58

The same operation was carried out as in the steps (i) to (v) of Example 42, except that in the step (iii) of Example 42, on the surface of the resin layer, $SiO_2$ was deposited and then $ZrO_2$ was deposited, thereby forming a coating film serving as an inorganic material layer.

The result is shown in Table 13.

Using the resin mold obtained, continuous photo-nanoimprinting of 20 shots was carried out. The imprinting was achieved without any problem.

TABLE 13

| | | | | Type of Oxide Film | | | | |
|---|---|---|---|---|---|---|---|---|
| | | | | | Ex. 42 | Ex. 52 | Ex. 53 | Ex. 54 |
| Mold | | Master mold | | | | I | | |
| | Substrate | | Type | | | PET | | |
| | | | Thickness (mm) | | | 0.125 | | |
| | Resin layer | Composition | Methyl methacrylate | | | 80 | | |
| | | | Glycidyl methacrylate | | | 20 | | |
| | | | Weight average molecular weight (Mw) ($\times 10^4$) | | | 8.3 | | |
| | | Thickness | Actual Film Thickness (μm) | | | 1.2 | | |
| | | | Form height × n (times) | | | 8 | | |
| | | | Adhesion with substrate | | | AA | | |
| | Inorganic material layer | | Film material | | $SiO_2$ | $ZrO_2$ | ITO | $TiO_2$ |
| | | | Treatment method | | | A | | |
| | | Thickness (nm) | a | | 4 | 4 | 4 | 4 |
| | | | b | | 4 | 4 | 4 | 4 |
| | | | c | | 4 | 4 | 5 | 5 |
| | | | d | | 5 | 5 | 5 | 5 |
| | | | Standard deviation | | 0.43 | 0.43 | 0.58 | 0.58 |
| | Release layer | | Release agent | | | HD-1100 | | |
| | | Thickness (nm) | e | | 3 | 3 | 3 | 3 |
| | | | f | | 3 | 3 | 3 | 3 |
| | | | g | | 3 | 3 | 3 | 3 |
| | | | h | | 2 | 2 | 2 | 2 |
| | | | Standard deviation | | 0.43 | 0.43 | 0.43 | 0.43 |
| | Contact angle with respect to water | | Before imprinting | | 110 | 110 | 110 | 110 |
| | | | After imprinting | | 108 | 106 | 106 | 106 |

TABLE 13-continued

| | | | | | | |
|---|---|---|---|---|---|---|
| | | Type of Oxide Film | | | | |
| | | Change ratio (%) between before and after imprintings | 1.8 | 3.6 | 3.6 | 3.6 |
| | Imprinting result | Macro inspection | AA | AA | AA | AA |
| | | SEM (cycle) | AA | AA | AA | AA |
| | | AFM (depth) | AA | AA | AA | AA |

| | | | | Ex. 55 | Ex. 56 | Ex. 57 | Ex. 58 |
|---|---|---|---|---|---|---|---|
| Mold | | Master mold | | | I | | |
| | Substrate | Type | | | PET | | |
| | | Thickness (mm) | | | 0.125 | | |
| | Resin layer | Composition | Methyl methacrylate | | 80 | | |
| | | | Glycidyl methacrylate | | 20 | | |
| | | Weight average molecular weight (Mw) (×10⁴) | | | 8.3 | | |
| | | Thickness | Actual Film Thickness(μm) | | 1.2 | | |
| | | | Form height × n (times) | | 8 | | |
| | | Adhesion with substrate | | | AA | | |
| | Inorganic material layer | Film material | | Si | SiO$_x$ | SiO$_2$ + ZrO$_2$ (mixture) | SiO$_2$/ZrO$_2$ (laminate) |
| | | Treatment method | | | A | | |
| | | Thickness (nm) | a | 4 | 4 | 5 | 5 |
| | | | b | 4 | 4 | 5 | 5 |
| | | | c | 5 | 4 | 6 | 6 |
| | | | d | 5 | 5 | 6 | 6 |
| | | Standard deviation | | 0.58 | 0.43 | 0.58 | 0.58 |
| | Release layer | Release agent | | | HD-1100 | | |
| | | Thickness (nm) | e | 3 | 3 | 3 | 3 |
| | | | f | 3 | 3 | 3 | 3 |
| | | | g | 3 | 3 | 3 | 3 |
| | | | h | 2 | 2 | 2 | 2 |
| | | Standard deviation | | 0.43 | 0.43 | 0.43 | 0.43 |
| | Contact angle with respect to water | Before imprinting | | 110 | 110 | 110 | 110 |
| | | After imprinting | | 106 | 106 | 106 | 106 |
| | | Change ratio (%) between before and after imprintings | | 3.6 | 3.6 | 3.6 | 3.6 |
| | Imprinting result | Macro inspection | | AA | AA | AA | AA |
| | | SEM (cycle) | | AA | AA | AA | AA |
| | | AFM (depth) | | AA | AA | AA | AA |

Inorganic material treatment method: as in Note of Table 10

Example 59

The same operation was carried out as in the steps (i) to (v) of Example 42, except that in the step (iv) of Example 42, the release agent liquid was changed to tridecafluoro(1,1,2,2-)tetrahydrooctyltrichlorosilane (manufactured by Gelest, Inc.).

The result is shown in Table 14.

Using the resin mold obtained, continuous photo-imprinting of 20 shots was carried out. The imprinting was achieved without any problem.

Example 60

The same operation was carried out as in the steps (i) to (v) of Example 42, except that in the step (iv) of Example 42, the release agent liquid was changed to perfluorohexanoic acid.

The result is shown in Table 14.

Using the resin mold obtained, continuous photo-imprinting of 20 shots was carried out. The imprinting was achieved without any problem.

Example 61

The same operation was carried out as in the steps (i) to (v) of Example 42, except that in the step (iv) of Example 42, the release agent liquid was changed to 1H,1H-tridecafluoroheptylamine.

The result is shown in Table 14.

Using the resin mold obtained, continuous photo-imprinting of 20 shots was carried out. The imprinting was achieved without any problem.

Example 62

The same operation was carried out as in the steps (i) to (v) of Example 42, except that in the step (iv) of Example 42, the release agent liquid was changed to methyl triisocyanate silane (product name: Orgatics SI-310, manufactured by Matsumoto Trading Co., Ltd.).

The result is shown in Table 14.

Using the resin mold obtained, continuous photo-imprinting of 20 shots was carried out. The imprinting was achieved without any problem.

TABLE 14

| | | | | Ex. 42 | Ex. 59 | Ex. 60 |
|---|---|---|---|---|---|---|
| Mold | | Master mold | | | I | |
| | Substrate | Type | | | PET | |
| | | Thickness (mm) | | | 0.125 | |
| | Resin layer | Composition | Methyl methacrylate | | 80 | |
| | | | Glycidyl methacrylate | | 20 | |
| | | Weight average molecular weight (Mw) ($\times 10^4$) | | | 8.3 | |
| | | Thickness | Actual Film Thickness (μm) | | 1.2 | |
| | | | Form height × n (times) | | 8 | |
| | | | Adhesion with substrate | | AA | |
| | Inorganic material layer | Film material | | | $SiO_2$ | |
| | | Treatment method | | | A | |
| | | Thickness (nm) | a | 4 | 4 | 4 |
| | | | b | 4 | 4 | 4 |
| | | | c | 4 | 4 | 4 |
| | | | d | 5 | 5 | 5 |
| | | Standard deviation | | 0.43 | 0.43 | 0.43 |
| Release layer | | Release agent | | HD-1100 | a | b |
| | | Thickness (nm) | e | 3 | 3 | 3 |
| | | | f | 3 | 3 | 3 |
| | | | g | 3 | 3 | 3 |
| | | | h | 2 | 2 | 2 |
| | | Standard deviation | | 0.43 | 0.43 | 0.43 |
| Contact angle with respect to water | | Before imprinting | | 110 | 110 | 110 |
| | | After imprinting | | 108 | 106 | 108 |
| | | Change ratio (%) between before and after imprintings | | 1.8 | 3.6 | 1.8 |
| Imprinting result | | Macro inspection | | AA | AA | AA |
| | | SEM (cycle) | | AA | AA | AA |
| | | AFM (depth) | | AA | AA | AA |

| | | | | Ex. 61 | Ex. 62 |
|---|---|---|---|---|---|
| Mold | | Master mold | | I | |
| | Substrate | Type | | PET | |
| | | Thickness (mm) | | 0.125 | |
| | Resin layer | Composition | Methyl methacrylate | 80 | |
| | | | Glycidyl methacrylate | 20 | |
| | | Weight average molecular weight (Mw) ($\times 10^4$) | | 8.3 | |
| | | Thickness | Actual Film Thickness (μm) | 1.2 | |
| | | | Form height × n (times) | 8 | |
| | | | Adhesion with substrate | AA | |
| | Inorganic material layer | Film material | | $SiO_2$ | |
| | | Treatment method | | A | |
| | | Thickness (nm) | a | 4 | 4 |
| | | | b | 4 | 4 |
| | | | c | 4 | 4 |
| | | | d | 5 | 5 |
| | | Standard deviation | | 0.43 | 0.43 |
| Release layer | | Release agent | | c | d |
| | | Thickness (nm) | e | 3 | 3 |
| | | | f | 3 | 3 |
| | | | g | 3 | 3 |
| | | | h | 2 | 2 |
| | | Standard deviation | | 0.43 | 0.43 |
| Contact angle with respect to water | | Before imprinting | | 110 | 103 |
| | | After imprinting | | 108 | 101 |
| | | Change ratio (%) between before and after imprintings | | 1.8 | 1.9 |
| Imprinting result | | Macro inspection | | AA | AA |
| | | SEM (cycle) | | AA | AA |
| | | AFM (depth) | | AA | AA |

Inorganic material treatment method: as in Note of Table 10
a: tridecafluoro(1,1,2,2)tetrahydrooctyltrichlorosilane
b: perfluorohexanoic acid
c: 1H,1H-tridecafluoroheptylamine
d: methyl triisocyanate silane

Example 63

A resin for a resin mold was prepared in the same manner as in the step (i) of Example 41, except that in the step (i) of Example 42, 80 parts by weight of methyl methacrylate was replaced by 80 parts by weight of styrene (product name: styrene monomer, manufactured by Idemitsu Kosan Co., Ltd.).

The resin obtained was subjected to the steps (ii) to (v) of Example 41.

The result is shown in Table 11.

Using the resin mold obtained, continuous photo-imprinting of 20 shots was carried out. The imprinting was achieved without any problem.

Example 64

A resin for a resin mold was prepared in the same manner as in the step (i) of Example 41, except that in the step (i) of Example 42, 80 parts by weight of methyl methacrylate was replaced by 80 parts by weight of isobonyl methacrylate (product name: IB-X, manufactured by Kyoeisha Chemical Co., Ltd.).

Using the resin obtained, the steps (ii) to (v) of Example 41 were carried out.

The result is shown in Table 11.

Using the resin mold obtained, continuous photo-imprinting of 20 shots was carried out. The imprinting was achieved without any problem.

Example 65

The same operation was carried out as in the steps (i) to (v) of Example 42, except that in the spin coating of the step (ii) of Example 42, the substrate was changed from the PET film to soda glass (manufactured by Asahi Glass Co., Ltd., thickness: 1.1 mm).

The result is shown in Table 15.

Using the resin mold obtained, continuous photo-imprinting of 20 shots was carried out. The imprinting was achieved without any problem.

Example 66

The same operation was carried out as in the steps (i) to (v) of Example 42, except that in the spin coating of the step (ii) of Example 42, the substrate was changed from the PET film to a silicon wafer (manufactured by Covalent Materials Corporation, grade used: polished wafer, thickness: 0.5 mm).

The result is shown in Table 15.

Using the resin mold obtained, continuous photo-imprinting of 20 shots was carried out. The imprinting was achieved without any problem.

Example 67

The same operation was carried out as in the steps (i) to (v) of Example 42, except that in the spin coating of the step (ii) of Example 42, the substrate was changed from the PET film to a sapphire substrate (manufactured by ORBE PIONEER LTD., semiconductor grade, thickness: 0.5 mm).

The result is shown in Table 15.

Using the resin mold obtained, continuous photo-imprinting of 20 shots was carried out. The imprinting was achieved without any problem.

Example 68

The same operation was carried out as in the steps (i) to (v) of Example 42, except that in the spin coating of the step (ii) of Example 42, the substrate was changed from the PET film to a polycarbonate film (product name: LEXAN, manufactured by Asahi Glass Co., Ltd., thickness: 0.12 mm).

The result is shown in Table 15.

Using the resin mold obtained, continuous photo-imprinting of 20 shots was carried out. The imprinting was achieved without any problem.

Example 69

The same operation was carried out as in the steps (i) to (v) of Example 42, except that in the spin coating of the step (ii) of Example 42, the substrate was changed from the PET film to a polyethylene naphthalate (PEN) film (product name: Teonex, manufactured by Teijin Chemicals, Ltd., thickness: 0.12 mm).

The result is shown in Table 15.

Using the resin mold obtained, continuous photo-imprinting of 20 shots was carried out. The imprinting was achieved without any problem.

Example 70

The same operation was carried out as in the steps (i) to (v) of Example 42, except that in the spin coating of the step (ii) of Example 42, the substrate was changed from the PET film to a polyimide film (product name: AURUM film, manufactured by Mitsui Chemicals, Inc., thickness: 0.3 mm).

The result is shown in Table 15.

Using the resin mold obtained, continuous photo-imprinting of 20 shots was carried out. The imprinting was achieved without any problem.

Example 71

The same operation was carried out as in the steps (i) to (v) of Example 42, except that in the spin coating of the step (ii) of Example 42, the substrate was changed from the PET film to a polymethyl methacrylate film (product name: ACRYPLEN, manufactured by Mitsubishi Rayon Co., Ltd., thickness: 0.12 mm).

The result is shown in Table 15.

Using the resin mold obtained, continuous photo-imprinting of 20 shots was carried out. The imprinting was achieved without any problem.

Example 72

The same operation was carried out as in the steps (i) to (v) of Example 42, except that in the spin coating of the step (ii) of Example 42, the substrate was changed from the PET film to a polysulfone film which surface had been subjected to coating treatment (film thickness: 1 μm) with diamond-like carbon (DLC) (product name: Geniuscoat DLC, manufactured by Nippon-ITF Inc., thickness: 0.12 mm).

The result is shown in Table 15.

Using the resin mold obtained, continuous photo-imprinting of 20 shots was carried out. The imprinting was achieved without any problem.

Example 73

The same operation was carried out as in the steps (i) to (v) of Example 42, except that in the spin coating of the step (ii) of Example 42, the substrate was changed from the PET film to glassy carbon (GC) (grade: SA-1, manufactured by Tokai Carbon Co., Ltd., thickness: 1.1 mm).

The result is shown in Table 15.

Using the resin mold obtained, continuous photo-imprinting of 20 shots was carried out. The imprinting was achieved without any problem.

Example 74

The same operation was carried out as in the steps (i) to (v) of Example 42, except that in the spin coating of the step (ii) of Example 42, the substrate was changed from the PET film to a silicon carbide (SiC) wafer (grade: 6HN-Type, manufactured by TankeBlue Semiconductor Co., Ltd., thickness: 0.43 mm).

The result is shown in Table 15.

Using the resin mold obtained, continuous photo-imprinting of 20 shots was carried out. The imprinting was achieved without any problem.

Example 75

The same operation was carried out as in the steps (i) to (v) of Example 42, except that in the spin coating of the step (ii) of Example 42, the substrate was changed from the PET film to a polysulfone film (product name: SUMILITE™ FJ-1200, manufactured by Sumitomo Bakelite Co., Ltd., thickness: 0.25 mm).

The result is shown in Table 15.

Using the resin mold obtained, continuous photo-imprinting of 20 shots was carried out. The imprinting was achieved without any problem.

TABLE 15

| | | | Type of Substrate | | Ex. 42 | Ex. 65 | Ex. 66 |
|---|---|---|---|---|---|---|---|
| Mold | | Master mold | | | | I | |
| | Substrate | | Type | | PET | Glass | Si wafer |
| | | | Thickness (mm) | | 0.125 | 1.1 | 0.5 |
| | Resin layer | Composition | Methyl methacrylate | | | 80 | |
| | | | Glycidyl methacrylate | | | 20 | |
| | | Weight average molecular weight (Mw) (×10$^4$) | | | | 8.3 | |
| | | Thickness | Actual Film Thickness (μm) | | | 1.3 | |
| | | | Form height × n (times) | | | 8 | |
| | | Adhesion with substrate | | | AA | AA | AA |
| | Inorganic material layer | Film material | | | | SiO$_2$ | |
| | | Treatment method | | | | A | |
| | | Thickness (nm) | a | | 4 | 4 | 4 |
| | | | b | | 4 | 4 | 4 |
| | | | c | | 4 | 4 | 4 |
| | | | d | | 5 | 5 | 5 |
| | | Standard deviation | | | 0.43 | 0.43 | 0.43 |
| | Release layer | Release agent | | | | HD-1100 | |
| | | Thickness (nm) | e | | 3 | 3 | 3 |
| | | | f | | 3 | 3 | 3 |
| | | | g | | 3 | 3 | 3 |
| | | | h | | 2 | 2 | 2 |
| | | Standard deviation | | | 0.43 | 0.43 | 0.43 |
| | Contact angle with respect to water | Before imprinting | | | 110 | 110 | 110 |
| | | After imprinting | | | 108 | 108 | 108 |
| | | Change ratio (%) between before and after imprintings | | | 1.8 | 1.8 | 1.8 |
| | Imprinting result | Macro inspection | | | AA | AA | AA |
| | | SEM (cycle) | | | AA | AA | AA |
| | | AFM (depth) | | | AA | AA | AA |

| | | | | | Ex. 67 | Ex. 68 | Ex. 69 |
|---|---|---|---|---|---|---|---|
| Mold | | Master mold | | | | I | |
| | Substrate | | Type | | sapphire | PC | PEN |
| | | | Thickness (mm) | | 0.5 | 0.12 | 0.12 |
| | Resin layer | Composition | Methyl methacrylate | | | 80 | |
| | | | Glycidyl methacrylate | | | 20 | |
| | | Weight average molecular weight (Mw) (×10$^4$) | | | | 8.3 | |
| | | Thickness | Actual Film Thickness (μm) | | | 1.3 | |
| | | | Form height × n (times) | | | 8 | |
| | | Adhesion with substrate | | | AA | AA | AA |
| | Inorganic material layer | Film material | | | | SiO$_2$ | |
| | | Treatment method | | | | A | |
| | | Thickness (nm) | a | | 4 | 4 | 4 |
| | | | b | | 4 | 4 | 4 |
| | | | c | | 4 | 4 | 4 |
| | | | d | | 5 | 5 | 5 |

TABLE 15-continued

| | | | Type of Substrate | | | |
|---|---|---|---|---|---|---|
| | | | Standard deviation | 0.43 | 0.43 | 0.43 |
| Release layer | | Release agent | | | HD-1100 | |
| | Thickness (nm) | | e | 3 | 3 | 3 |
| | | | f | 3 | 3 | 3 |
| | | | g | 3 | 3 | 3 |
| | | | h | 2 | 2 | 2 |
| | | Standard deviation | | 0.43 | 0.43 | 0.43 |
| Contact angle with respect to water | | Before imprinting | | 110 | 108 | 110 |
| | | After imprinting | | 108 | 106 | 108 |
| | | Change ratio (%) between before and after imprintings | | 1.8 | 1.9 | 1.8 |
| Imprinting result | | Macro inspection | | AA | AA | AA |
| | | SEM (cycle) | | AA | AA | AA |
| | | AFM (depth) | | AA | AA | AA |

| | | | | Ex. 70 | Ex. 71 | Ex. 72 |
|---|---|---|---|---|---|---|
| | | Master mold | | | I | |
| Mold | Substrate | Type | | polyimide | PMMA | DLC |
| | | Thickness (mm) | | 0.3 | 0.12 | 0.12 |
| | Resin layer | Composition | Methyl methacrylate | | 80 | |
| | | | Glycidyl methacrylate | | 20 | |
| | | Weight average molecular weight (Mw) (×10$^4$) | | | 8.3 | |
| | | Thickness | Actual Film Thickness (μm) | | 1.3 | |
| | | | Form height × n (times) | | 8 | |
| | | Adhesion with substrate | | AA | AA | AA |
| | Inorganic material layer | Film material | | | SiO$_2$ | |
| | | Treatment method | | | A | |
| | | Thickness (nm) | a | 4 | 4 | 4 |
| | | | b | 4 | 4 | 4 |
| | | | c | 4 | 4 | 4 |
| | | | d | 5 | 5 | 5 |
| | | Standard deviation | | 0.43 | 0.43 | 0.43 |
| | Release layer | Release agent | | | HD-1100 | |
| | | Thickness (nm) | e | 3 | 3 | 3 |
| | | | f | 3 | 3 | 3 |
| | | | g | 3 | 3 | 3 |
| | | | h | 2 | 2 | 2 |
| | | Standard deviation | | 0.43 | 0.43 | 0.43 |
| Contact angle with respect to water | | Before imprinting | | 110 | 110 | 110 |
| | | After imprinting | | 108 | 108 | 107 |
| | | Change ratio (%) between before and after imprintings | | 1.8 | 1.8 | 2.7 |
| Imprinting result | | Macro inspection | | AA | AA | AA |
| | | SEM (cycle) | | AA | AA | AA |
| | | AFM (depth) | | AA | AA | AA |

| | | | | Ex. 73 | Ex. 74 | Ex. 75 |
|---|---|---|---|---|---|---|
| | | Master mold | | | I | |
| Mold | Substrate | Type | | GC | SiC | PSF |
| | | Thickness (mm) | | 1.0 | 0.43 | 0.12 |
| | Resin layer | Composition | Methyl methacrylate | | 80 | |
| | | | Glycidyl methacrylate | | 20 | |
| | | Weight average molecular weight (Mw) (×10$^4$) | | | 8.3 | |
| | | Thickness | Actual Film Thickness (μm) | | 1.3 | |
| | | | Form height × n (times) | | 8 | |
| | | Adhesion with substrate | | AA | AA | AA |
| | Inorganic material layer | Film material | | | SiO$_2$ | |
| | | Treatment method | | | A | |
| | | Thickness (nm) | a | 4 | 4 | 4 |
| | | | b | 4 | 4 | 4 |
| | | | c | 4 | 4 | 4 |
| | | | d | 5 | 5 | 5 |
| | | Standard deviation | | 0.43 | 0.43 | 0.43 |
| | Release layer | Release agent | | | HD-1100 | |
| | | Thickness (nm) | e | 3 | 3 | 3 |
| | | | f | 3 | 3 | 3 |
| | | | g | 3 | 3 | 3 |
| | | | h | 2 | 2 | 2 |
| | | Standard deviation | | 0.43 | 0.43 | 0.43 |
| Contact angle with respect to water | | Before imprinting | | 110 | 110 | 110 |
| | | After imprinting | | 108 | 108 | 107 |

TABLE 15-continued

| | Type of Substrate | | | |
|---|---|---|---|---|
| | Change ratio (%) between before and after imprintings | 1.8 | 1.8 | 2.7 |
| Imprinting result | Macro inspection | AA | AA | AA |
| | SEM (cycle) | AA | AA | AA |
| | AFM (depth) | AA | AA | AA |

Inorganic material treatment method: As in Note of Table 10

Example 76

In the step (i) of Example 41, instead of methyl methacrylate, cyclohexylmethacrylate (product name: LIGHT ETSER CH, manufactured by Kyoeisha Chemical Co., Ltd.) was used to produce a polymer of cyclohexylmethacrylate, and this polymer was spin coated on a glass substrate. The resin laminate was heated to 130° C., thereby preparing a transfer sheet.

Using the transfer sheet thus obtained, the resin mold (which had been subjected to release treatment, a transfer surface of 576 mm$^2$, 150 mmL/S) prepared in the steps of (i) to (iv) of Example 42 was pressed to carryout heat transferring at 80° C. In the heat transferring, the pressing pressure was 20 MPa, and the retention time was 5 minutes.

Five minutes thereafter, the laminate was cooled to 55° C. The resin mold was detached, and was found not to have a transfer defect.

The result is shown in Table 16.

Using this resin mold, continuous photo-imprinting of 20 shots was carried out. The imprinting was achieved without any problem.

Example 77

In the step (v) of Example 42, the resin mold obtained in the step (v) was wound around a roll, and the roll was pressed on a polycarbonate resin (product name: LEXAN film, manufactured by Asahi Glass Co., Ltd., a transfer region width of 21 mm, 200 cm) at a pressing pressure of 1.0 MPa. In such a state to enable uniform coating of a photo-curable resin (PAK-02, manufactured by Toyo Gosei, Co., Ltd.), a line was moved using a hand-made device (a moving rate of 1 m/min).

Then, while moving the line, ultraviolet ray was applied (70 mW/cm$^2$) for 1 second to cure the resin, thereby carrying out roll imprinting continuously for 5 minutes, whereby a molded film of 5 m was obtained. Then, the resin mold was detached from the roll, and it was confirmed that the mold had no transfer defect.

A contact angle was measured in the same manner as in the step (iv) of Example 41, and found to have no change.

Further, the presence of form change in the resin subjected to transferring was observed with SEM and AFM.

The result is shown in Table 16.

TABLE 16

| | | | | Use Examples | | |
|---|---|---|---|---|---|---|
| | | | | Ex. 42 | Ex. 76 | Ex. 77 |
| Mold structure | Substrate | Master mold | | | I | |
| | | Type | | | PET | |
| | | Thickness (mm) | | | 0.125 | |
| | Resin layer | Composition | Methyl methacrylate | | 80 | |
| | | | Glycidyl methacrylate | | 20 | |
| | | Weight average molecular weight (Mw) (×10$^4$) | | | 8.3 | |
| | | Thickness | Actual Film Thickness (μm) | | 1.2 | |
| | | | Form height × n (times) | | 8 | |
| | | Adhesion with substrate | | | AA | |
| | Inorganic material layer | Film material | | | SiO$_2$ | |
| | | Treatment method | | | A | |
| | | Thickness (nm) | a | | 4 | |
| | | | b | | 4 | |
| | | | c | | 4 | |
| | | | d | | 5 | |
| | | Standard deviation | | | 0.43 | |
| | Release layer | Release agent | | | HD-1100 | |
| | | Thickness (nm) | e | | 3 | |
| | | | f | | 3 | |
| | | | g | | 3 | |
| | | | h | | 2 | |
| | | Standard deviation | | | 0.43 | |
| | Contact angle with respect to water | Before imprinting | | 110 | 110 | 110 |
| | | After imprinting | | 108 | 108 | 108 |
| | | Change ratio (%) between before and after imprintings | | 1.8 | 1.8 | 1.8 |
| | Nanoimprinting method | | | UV/batch (sheet) | UV/batch (sheet) | UV/continuous (roll) |
| | Imprinting result | Macro inspection | | AA | AA | AA |
| | | SEM (cycle) | | AA | AA | AA |
| | | AFM (depth) | | AA | AA | AA |

Inorganic material treatment method: As in Note of Table 10

Reference Example 5

The same operation was carried out as in the steps (i) to (v) of Example 41, except that in the step (iii) of Example 42, vacuum deposition was carried out for 60 seconds with the device subjected to rotation but not to revolution.

As a result, an edge portion of the transferred recessed and projected form sometimes had a defect of the oxide film layer, and from this portion, the peeling of the release layer occurred in photo-nanoimprinting.

Reference Example 6

The same operation was carried out as in the steps (i) to (v) of Example 41, except that in the step (iii) of Example 44, vacuum deposition was carried out for 60 seconds with the device subjected to revolution but not to rotation.

As a result, the transferred oxide film layer had a biased thickness, which resulted in a different size at nano scale from the size of the master mold. Thus, it was clear that there would be a form change after photo-nanoimprinting.

Reference Example 7

In the step (i) of Example 44, the usage amounts of methyl methacrylate and 1,2-epoxyvinyl cyclohexane were changed to 49.0 parts by weight and 51.0 parts by weight, respectively, thereby attempting to produce a resin. However, the excessive amount of 1,2-epoxyvinylcyclohexane caused gelation, failing to produce a polymer.

Comparative Example 5

The same operation was carried out as in the steps (i), (ii) and (v) of Example 41, but the steps (iii) and (iv) of Example 42 were not carried out, i.e., the surface of the resin mold was not coated with the oxide film and the release treatment of the resin mold coated with the oxide film was not carried out. As a result, in the step (v), the transfer-adhering of the resin was visually observed.

A contact angle was 30°.

The result is shown in Table 17.

Comparative Example 6

The same operation was carried out as in the steps (i), (ii), (iv) and (v) of Example 41, but the step (iii) of Example 42 was not carried out, i.e., the surface of the resin mold was not coated with the oxide film. As a result, in the step (v), the transfer-adhering of the resin was visually observed.

A contact angle was 30°.

The result is shown in Table 17.

Comparative Example 7

The same operation was carried out as in the steps (i), (ii), (iii) and (v) of Example 41, but the step (iv) of Example 42, i.e., the release treatment of the resin mold coated with the oxide film, was not carried out. As a result, in the step (v), the transfer-adhering of the resin was slightly recognized by visual observation.

A contact angle was 40°.

The result is shown in Table 17.

Reference Example 8

The same operation was carried out as in Example 41, except that in the step (iii) of Example 42, the thickness of $SiO_2$ was changed to less than 0.5 nm. As a result, because of the too small thickness of the $SiO_2$ film, the adhesion was not sufficiently retained between the $SiO_2$ film and the release agent layer formed on the surface of the film composed of the oxide, increasing the occurrence rate of the micro peeling of the release agent and lowering the imprinting precision in the photo-imprinting of the step (v).

The result is shown in Table 17.

The thickness of the $SiO_2$ film layer was too small to measure, and thus is a calculated value in view of the deposition conditions.

Reference Example 9

The same operation was carried out as in Example 41, except that in the step (iii) of Example 42, the thickness of $SiO_2$ was changed to 120 nm. As a result, because of the too large thickness of the $SiO_2$ film, a crack was likely to be generated in deposition, and the transfer-adhering of the resin sometimes occurred from this crack in the resin mold in the photo-imprinting of the step (v).

The result is shown in Table 17.

Example 78

A resin mold was prepared in the same manner as in Example 41, except that in the step (i) of Example 42, the thickness of the resin was changed to 0.12 μm.

However, the thickness of the resin was not necessarily recognized to be sufficient compared with the height of the recess and projection formed on the master mold. The thickness of the resin needs to be one time or more the depth of the recess and projection (in the present invention, 150 nm) formed on the master mold.

The result is shown in Table 17.

Example 79

The same operation was carried out as in Example 41, except that in the step (i) of Example 42, the thickness of the resin was changed to 2.7 μm.

In the heat imprinting during the preparation of the resin mold, the recess and projection formed on the master mold was transferred at a pressing pressure of 20 MPa. As a result, because of the thickness of the resin being too large compared with the depth (in the present Example, 150 nm) formed on the master mold, the resin at the transferred portion sometimes flew out, causing a problem with the uniformity of the resin of the resin mold produced.

Such flowing-out of the resin is prevented by defining the thickness of the resin so as to be not more than 15 times the depth of the recess and projection formed on the master mold.

The result is shown in Table 17.

The same operation was carried out as in Example 41, except that in the step (i) of Example 42, the thickness of the resin was changed to 4.5 μm.

In the heat imprinting during the preparation of a resin mold, the recess and projection formed on the master mold was transferred at a pressing pressure of 20 MPa. As a result, because of the thickness of the resin being too large compared with the depth (in the present Example, 150 nm) formed on the master mold, the resin at the transferred portion flew out. Thus, the step (iii) (formation of an oxide film) was not carried out.

The thickness of the resin needs to be not more than 15 times the depth of the recess and projection formed on the master mold.

The result is shown in Table 17.

TABLE 17

| | | | Comparative Examples | | |
|---|---|---|---|---|---|
| | | | Com. Ex. 5 | Com. Ex. 6 | Com. Ex. 7 |
| Mold | | Master mold | | I | |
| | Substrate | Type | | PET | |
| | | Thickness (mm) | | 0.125 | |
| | Resin layer | Composition Methyl methacrylate | | 80 | |
| | | Glycidyl methacrylate | | 20 | |
| | | Weight average molecular weight (Mw) (×10$^4$) | | 8.3 | |
| | | Thickness Actual Film Thickness (μm) | | 1.2 | |
| | | Form height × n (times) | | 8 | |
| | | Adhesion with substrate | AA | AA | AA |
| | Inorganic material layer | Film material | — | — | SiO$_2$ |
| | | Treatment method | | | A |
| | | Thickness a | | | 4 |
| | | (nm) b | | | 4 |
| | | c | | | 4 |
| | | d | | | 3 |
| | | Standard deviation | | | 0.43 |
| | Release layer | Release agent | — | HD-1100 | — |
| | | Thickness e | | 3 | |
| | | (nm) f | | 3 | |
| | | g | | 3 | |
| | | h | | 2 | |
| | | Standard deviation | | 0.43 | |
| | Contact angle with respect to water | Before imprinting | 30 | 30 | 40 |
| | | After imprinting | 23 | 23 | 25 |
| | | Change ratio (%) between before and after imprintings | 23.3 | 23.3 | 37.5 |
| | Imprinting result | Macro inspection | BB | BB | BB |
| | | SEM (cycle) | BB | BB | BB |
| | | AFM (depth) | BB | BB | BB |

| | | | Ref. Ex. 8 | Ref. Ex. 9 |
|---|---|---|---|---|
| Mold | | Master mold | I | |
| | Substrate | Type | PET | |
| | | Thickness (mm) | 0.125 | |
| | Resin layer | Composition Methyl methacrylate | 80 | |
| | | Glycidyl methacrylate | 20 | |
| | | Weight average molecular weight (Mw) (×10$^4$) | 8.3 | |
| | | Thickness Actual Film Thickness (μm) | 1.2 | |
| | | Form height × n (times) | 8 | |
| | | Adhesion with substrate | AA | AA |
| | Inorganic material layer | Film material | SiO$_2$ | |
| | | Treatment method | A | |
| | | Thickness a | less than 0.5 | 120 |
| | | (nm) b | less than 0.5 | 120 |
| | | c | less than 0.5 | 116 |
| | | d | less than 0.5 | 118 |
| | | Standard deviation | immeasurable | 1.66 |
| | Release layer | Release agent | HD-1100 | |
| | | Thickness e | 3 | 3 |
| | | (nm) f | 3 | 3 |
| | | g | 3 | 3 |
| | | h | 2 | 2 |
| | | Standard deviation | 0.43 | 0.43 |
| | Contact angle with respect to water | Before imprinting | 92 | 90 |
| | | After imprinting | 70 | 75 |
| | | Change ratio (%) between before and after imprintings | 23.9 | 16.7 |
| | Imprinting result | Macro inspection | BB | BB |
| | | SEM (cycle) | AA | BB |
| | | AFM (depth) | AA | BB |

TABLE 17-continued

| | | | | Comparative Examples | | |
|---|---|---|---|---|---|---|
| | | | | Ex. 78 | Ex. 79 | Ref. Ex. 11 |
| Mold | | Master mold | | | I | |
| | Substrate | Type | | | PET | |
| | | Thickness (mm) | | | 0.125 | |
| | Resin layer | Composition | Methyl methacrylate | | 80 | |
| | | | Glycidyl methacrylate | | 20 | |
| | | Weight average molecular weight (Mw) (×10$^4$) | | | 8.3 | |
| | | Thickness | Actual Film Thickness (μm) | 0.12 | 2.7 | 4.5 |
| | | | Form height × n (times) | 0.8 | 1.8 | 30 |
| | | | Adhesion with substrate | AA | AA | AA |
| | Inorganic material layer | Film material | | SiO$_2$ | SiO$_2$ | — |
| | | Treatment method | | A | A | — |
| | | Thickness (nm) | a | 4 | 4 | — |
| | | | b | 4 | 4 | — |
| | | | c | 4 | 4 | — |
| | | | d | 3 | 3 | — |
| | | Standard deviation | | 0.43 | 0.43 | — |
| Release layer | | Release agent | | HD-1100 | | — |
| | | Thickness (nm) | e | 3 | 3 | — |
| | | | f | 3 | 3 | — |
| | | | g | 3 | 3 | — |
| | | | h | 2 | 2 | — |
| | | Standard deviation | | 0.43 | 0.43 | — |
| | Contact angle with respect to water | Before imprinting | | 110 | 110 | — |
| | | After imprinting | | 108 | 108 | — |
| | | Change ratio (%) between before and after imprintings | | 1.8 | 1.8 | — |
| Imprinting result | | Macro inspection | | AA | AA | — |
| | | SEM (cycle) | | AA | BB | — |
| | | AFM (depth) | | BB | BB | — |

Inorganic material treatment method: As in Note of Table 10
Thickness of Release agent layer in Ref. Ex. 5 is difficult to measure with SEM
—: Step was not carried out because of severe deformation

Reference Example 12

The same operation was carried out as in Example 41, except that in the step (iv) of Example 42 (the step of forming a release agent layer), the thickness of the release agent layer was changed to less than 0.5 nm. As a result, because of the release layer being so thin, the resin releasing efficiency decreased.

Accordingly, the precision of the imprinting decreased in the photo-nanoimprinting of the step (v).

The result is shown in Table 18.

The thickness of the release agent layer was too small to measure, and thus is a calculated value in view of the treatment conditions.

Reference Example 13

The same operation was carried out as in Example 41, except that in the step (iv) of Example 42 (the step of forming a release agent layer), the thickness of the release agent layer was changed to 21.0 nm. As a result, because of the release layer being so thick, the resin subjected to transferring had a form change in photo-nanoimprinting of the step (v).

The result is shown in Table 18.

TABLE 18

| | | | Reference Examples (Thickness of Release Layer) | |
|---|---|---|---|---|
| | | | | Ref. Ex. 12 | Ref. Ex. 13 |
| Mold | | Master mold | | I | |
| | Substrate | Type | | PET | |
| | | Thickness (mm) | | 0.12 | |
| | Resin layer | Composition | Methyl methacrylate | 80 | |
| | | | Glycidyl methacrylate | 20 | |
| | | Weight average molecular weight (Mw)(×10$^4$) | | 8.3 | |
| | | Thickness | Actual Film Thickness (μm) | 1.2 | |
| | | | Form height × n (times) | 8 | |
| | | | Adhesion with substrate | AA | |
| | Inorganic material layer | Film material | | SiO$_2$ | |
| | | Treatment method | | A | |
| | | Thickness (nm) | a | 4 | |
| | | | b | 4 | |
| | | | c | 4 | |
| | | | d | 5 | |

TABLE 18-continued

Reference Examples
(Thickness of Release Layer)

| | | | Ref. Ex. 12 | Ref. Ex. 13 |
|---|---|---|---|---|
| | | Standard deviation | 0.43 | |
| Release | | Release agent | HD-1100 | |
| layer | Thickness | e | less than 0.5 | 21 |
| | (nm) | f | less than 0.5 | 21 |
| | | g | less than 0.5 | 18 |
| | | h | less than 0.5 | 16 |
| | | Standard deviation | incalculable | 2.45 |
| Contact angle with respect to water | | Before imprinting | 80 | 110 |
| | | After imprinting | 66 | 108 |
| | | Change ratio (%) between before and after imprintings | 17.5 | 1.8 |
| Imprinting result | | Macro inspection | BB | AA |
| | | SEM (cycle) | BB | BB |
| | | AFM (depth) | BB | BB |

DESCRIPTION OF MARKS

1: release agent layer
2: inorganic material layer
3: resin layer
4: substrate
5: resin
6: substrate
7: roller type resin mold for imprinting
8: light source

The invention claimed is:

1. A resin mold for imprinting comprising:
a resin layer having a recessed and projected pattern surface,
an inorganic material layer formed with a uniform thickness on at least the recessed and projected pattern surface of the resin layer, and
a release agent layer formed with a uniform thickness on at least the recessed and projected pattern surface of the inorganic material layer;
wherein the thickness of the resin layer is 1 to 15 times the height of a recess and projection formed on a surface of a master mold which provides recess and projection on the resin layer,
wherein the thickness of the resin layer is 50 nm to 10 μm, and
wherein the inorganic layer is formed with uniform thickness with a standard deviation of 0.1 to 1.09.

2. The resin mold for imprinting according to claim 1, wherein the release agent layer has a thickness of 0.5 to 20 nm.

3. The resin mold for imprinting according to claim 1, wherein the inorganic material layer has a thickness of 0.5 to 100 nm.

4. The resin mold for imprinting according to claim 1, wherein the inorganic material layer is composed of at least one inorganic material selected from the group consisting of $SiO_2$, $ZrO_2$, $ZnO$, $Ta_2O_5$, $HfO_2$, ITO, FTO, $TiO_2$, Si and SiC.

5. The resin mold for imprinting according to claim 1, wherein the release agent layer is composed of at least one release agent selected from the group consisting of a fluorine-based silane coupling agent, a perfluoro compound having an amino group or a carboxyl group, and a perfluoroether compound having an amino group or a carboxyl group.

6. The resin mold for imprinting according to claim 1, wherein the resin layer is composed of a thermoplastic resin, a thermosetting resin, or a photo-curable resin.

7. The resin mold for imprinting according to claim 1, wherein the resin layer is at least one resin selected from the group consisting of an acrylic resin, a styrene resin, an epoxy resin, a polyester resin, an olefin resin, and a polycarbonate resin.

8. The resin mold for imprinting according to claim 1, wherein a contact angle of a surface of the release agent layer with respect to pure water is 100° or more.

9. The resin mold for imprinting according to claim 1, wherein in a desired form formed on a surface of the resin layer, the surface form has a repeating unit having a cycle of 10 nm to 50 μm.

10. The resin mold for imprinting according to claim 1, which is fixed to a roller.

11. A resin mold for imprinting comprising:
a substrate,
a resin layer having a recessed and projected pattern surface formed on the substrate,
an inorganic material layer formed with a uniform thickness on at least the recessed and projected pattern surface of the resin layer, and
a release agent layer formed with a uniform thickness on at least the recessed and projected pattern surface of the inorganic material layer,
wherein the thickness of the resin layer is 1 to 15 times the height of a recess and projection formed on a surface of a master mold which provides recess and projection on the resin layer,
wherein the thickness of the resin layer is 50 nm to 10 μm, and
wherein the inorganic layer is formed with uniform thickness with a standard deviation of 0.1 to 1.09.

12. The resin mold for imprinting according to claim 11, wherein the substrate is at least one substrate selected from the group consisting of a resin, glass, silicon, sapphire, gallium nitride, carbon and silicon carbide.

13. The resin mold for imprinting according to claim 11, wherein the substrate is at least one resin selected from the group consisting of polyethylene terephthalate, polycarbonate, polyester, polymethyl methacrylate, polystyrene, polyolefin, polyimide, polysulfone, polyether sulfone, and polyethylene naphthalate.

* * * * *